US008656245B2

(12) United States Patent
Hamkins

(10) Patent No.: US 8,656,245 B2
(45) Date of Patent: Feb. 18, 2014

(54) METHOD OF ERROR FLOOR MITIGATION IN LOW-DENSITY PARITY-CHECK CODES

(75) Inventor: Jon Hamkins, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 148 days.

(21) Appl. No.: 13/442,755

(22) Filed: Apr. 9, 2012

(65) Prior Publication Data

US 2012/0266040 A1 Oct. 18, 2012

Related U.S. Application Data

(60) Provisional application No. 61/474,861, filed on Apr. 13, 2011.

(51) Int. Cl.
*H03M 13/00* (2006.01)

(52) U.S. Cl.
USPC .......................................................... 714/752

(58) Field of Classification Search
None
See application file for complete search history.

(56) References Cited

U.S. PATENT DOCUMENTS

| 7,343,539 | B2 | 3/2008 | Divsalar et al. | |
|---|---|---|---|---|
| 7,398,453 | B2 * | 7/2008 | Yu | 714/778 |
| 2005/0283707 | A1 * | 12/2005 | Sharon et al. | 714/758 |
| 2007/0089024 | A1 * | 4/2007 | Yu | 714/758 |
| 2010/0241921 | A1 * | 9/2010 | Gunnam | 714/752 |
| 2012/0079341 | A1 * | 3/2012 | Wajcer et al. | 714/752 |

OTHER PUBLICATIONS

The development of turbo and LDPC codes for deep-space applications, *Proceedings of the IEEE*, 95(11):2142-2156, Nov. 2007.
TM Synchronization and Channel Coding, CCSDS 131.1-B-2. Blue Book, Issue 2. Aug. 2011.
E. Agrell, J. Lassing, E.G. Strom, and T. Ottosson, "On the optimality of the binary reflected Gray code," *IEEE Trans. Inform. Theory*, 50(12):3170-3182, 2004.
Cheng, D. Divsalar, and S. Duy, "Structured low-density parity-check codes with bandwidth efficient modulation," in *Proceedings of SPIE Conference on Defense Security and Sensing*, Apr. 2009.
K. S. Andrews, D. Divsalar, S. Dolinar, J. Hamkins, C. R. Jones, and F. Pollara, "The development of turbo and LDPC codes for deep-space applications," *Proceedings of the IEEE*, 95(11):2142-2156, Nov. 2007.
Tom Richardson and Ruediger Urbanke, *Modern Coding Theory*, Cambridge University Press, 2008, Forward, Content and Preface.
ETSI EN 302 307 v1.1.2, "Digital Video Broadcasting (DVB): Second generation framing structure, channel coding and modulation systems for broadcasting, interactive services, news gathering and other broadband satellite applications", Jun. 2006.
Low density parity check codes for use in near-Earth and deep space. CCSDS 131.1-O-2. Orange Book, Issue 2. Sep. 2007, http://public.ccsds.org/publications/archive/131x102e2.pdf.
Agrell, E. et al., On the optimality of the binary reflected Gray code. IEEE Trans. Inform. Theory, 2004, vol. 50, Issue 12, pp. 3170-3182.
Andrews, K. et al. Encoders for block-circulant LDPC codes. In Proc. IEEE Int. Symp. Inf. Theory, Sep. 2005, pp. 2300-2304.
Dolinar, S. et al., Code performance as a function of block size. TDA Progress Report, May 1998, vol. 42 Issue 133.

* cited by examiner

*Primary Examiner* — Guerrier Merant
(74) *Attorney, Agent, or Firm* — Steinfl & Bruno LLP

(57) ABSTRACT

A digital communication decoding method for low-density parity-check coded messages. The decoding method decodes the low-density parity-check coded messages within a bipartite graph having check nodes and variable nodes. Messages from check nodes are partially hard limited, so that every message which would otherwise have a magnitude at or above a certain level is re-assigned to a maximum magnitude.

20 Claims, 15 Drawing Sheets

| Natural | Gray | Anti-Gray | DVB-16 | DVB-32 |
|---|---|---|---|---|
| 0 | 0 | 0 0 0 0 0 | 12 | 17 |
| 1 | 1 | 1 3 7 15 31 | 14 | 21 |
| 2 | 3 | 1 1 1 | 15 | 23 |
| 3 | 2 | 2 6 14 30 | 13 | 19 |
| 4 | 6 | 3 3 3 | 4 | 16 |
| 5 | 7 | 4 12 28 | 0 | 0 |
| 6 | 5 | 2 2 2 | 8 | 1 |
| 7 | 4 | 5 13 29 | 10 | 5 |
| 8 | 12 | 6 6 | 2 | 4 |
| 9 | 13 | 9 25 | 6 | 20 |
| 10 | 15 | 7 7 | 7 | 22 |
| 11 | 14 | 8 24 | 3 | 6 |
| 12 | 10 | 5 5 | 11 | 7 |
| 13 | 11 | 10 26 | 9 | 3 |
| 14 | 9 | 4 4 | 1 | 2 |
| 15 | 8 | 11 27 | 5 | 18 |
| 16 | 24 | 12 | | 24 |
| 17 | 25 | 19 | | 8 |
| 18 | 27 | 13 | | 25 |
| 19 | 26 | 18 | | 9 |
| 20 | 30 | 15 | | 13 |
| 21 | 31 | 16 | | 29 |
| 22 | 29 | 14 | | 12 |
| 23 | 28 | 17 | | 28 |
| 24 | 20 | 10 | | 30 |
| 25 | 21 | 21 | | 14 |
| 26 | 23 | 11 | | 31 |
| 27 | 22 | 20 | | 15 |
| 28 | 18 | 9 | | 11 |
| 29 | 19 | 22 | | 27 |
| 30 | 17 | 8 | | 10 |
| 31 | 16 | 23 | | 28 |

METHOD OF ERROR FLOOR MITIGATION IN LOW-DENSITY PARITY-CHECK CODES

CROSS-REFERENCE TO RELATED APPLICATIONS

The present application is related to and claims the benefit of the following commonly assigned U.S. Patent Application: U.S. Patent Application No. 61/474,861, "Method of Error Floor Mitigation in Low-Density Parity-Check Codes," filed on Apr. 13, 2011; the entire contents of which is incorporated herein by reference.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

BACKGROUND

1. Field

The present disclosure relates to the decoding of low-density parity-check (LDPC) codes. More in particular, it relates to methods for improving the performance of iterative decoders for LDPC codes which may be used with modulation levels above simple binary signaling.

2. Description of Related Art

As known to the person skilled in the art and as also mentioned in U.S. Pat. No. 7,343,539 incorporated herein by reference in its entirety, a low-density parity-check (LDPC) code is a linear code determined by a sparse parity-check matrix H having a small number of 1 s per column. The code's parity-check matrix H can be represented by a bipartite Tanner graph wherein each column of H is represented by a transmitted variable node, each row by a check node, and each "1" in H by a graph edge connecting the variable node and check node that correspond to the column-row location of the "1". The code's Tanner graph may additionally have non-transmitted variable nodes. Each check or constraint node defines a parity check operation. Moreover, the fraction of a transmission that bears information is called the rate of the code. An LDPC code can be encoded by deriving an appropriate generator matrix G from its parity-check matrix H. An LDPC code can be decoded efficiently using a well-known iterative algorithm that passes messages along edges of the code's Tanner graph from variable nodes to check nodes and vice-versa until convergence is obtained, or a certain number of iterations is reached.

Forward error correction using LDPC codes is being used for deep-space and other aerospace applications as described by K. S. Andrews, D. Divsalar, S. Dolinar, J. Hamkins, C. R. Jones, and F. Pollara in "The development of turbo and LDPC codes for deep-space applications," *Proceedings of the IEEE*, 95(11):2142-2156, November 2007. A set of LDPC codes has been approved as an international standard by the Consultative Committee for Space Data Systems (CCSDS) (see "TM Synchronization and Channel Coding," CCSDS 131.1-B-2. Blue Book, Issue 2. August 2011). The standard LDPC codes include a family of nine accumulate repeat-4 jagged accumulate (AR4JA) LDPC codes, available in any combination of three code rates (½, ⅔, and ⅘) and three input block lengths (1024, 4096, and 16384).

FIG. 24 shows a block diagram of a system in which LDPC encoding is used for the transmission of information. As shown in FIG. 24, an encoder 110 applies the selected LDPC encoding scheme. A modulator 120 is then used to apply modulation to encoded characters. Since the information will be transmitted within a noisy environment (as is seen with free-space transmission) noise is modeled as being additive 150. A demodulator 130 is used to demodulate a received signal. A decoder 140 is used to decode the demodulated signal to recover the original information. These various components will be described in additional detail below, along with the impact of noise.

The encoder 110 shown in FIG. 24 will be discussed first. Since the AR4JA LDPC codes are binary, linear codes, encoding is accomplished by multiplying, in GF(2), an information vector by a generator matrix. The AR4JA codes have a number of features that simplify the encoding process. First, they are systematic, which means the information bits appear unchanged in the encoded codeword. Therefore, only the final n−k columns of the k×n generator matrix need be stored by the encoder. The codes are also quasi-cyclic, which is a result of using circulants to permute edges of the protograph copies. An encoder storing only rows 1, m+1, 2m+1, ..., where m is the circulant size, may generate the other rows on the fly using shift registers.

In a software implementation, it may remain most convenient and efficient to store the last n−k columns of the generator matrix in their entirety, not making use of the quasi-cyclic property, and performing the encoding operation using standard matrix multiplication. In a high-level language such as C, individual bit operations are not as efficient as operations that are applied on registers that are 32 or 64 bits wide. Therefore, in C it is efficient to break each of the n−k columns into 64-bit segments, and store each segment in a 64-bit wide "long int" data structure. In this way, in one operation, 64-bits of information can be XORed with a 64-bit portion of the generator column, and the final codebit determined from the parity of all such 64-bit operations of the column. Since the input lengths of each of the AR4JA codes are a multiple of 64, this approach makes efficient use of the 64-bit data structures.

Possible implementations of the modulator 120 shown in FIG. 24 are discussed below. Several modulation types are described below, along with their associated complex signal constellations, default indexing, and average complex baseband energy. The signal constellations for these modulations are shown in FIGS. 1A-1E. In summary, the modulations discussed below include: Binary Phase Shift Keyed (BPSK); Quadrature Phase Shift Keyed (QPSK), 8 Phase Shift Keyed (8-PSK); 16 Amplitude Phase Shift Keyed (16-APSK), and 32 Amplitude Phase Shift Keyed (32-APSK).

BPSK is a real-valued constellation with two signal points: $c(0)=A$ and $c(1)=-A$, where A is a scaling factor. This constellation is shown in FIG. 1A. The average complex baseband symbol energy is $E_s=E[c(i)^2]=A^2$.

QPSK is a complex constellation with four signal points, with $$c(i) = \sqrt{2} A \exp\left[j\frac{\pi}{2}\left(i + \frac{1}{2}\right)\right],$$

for i=0, 1, 2, 3. This constellation is shown in FIG. 1B. It is convenient to include the $\sqrt{2}$ factor so that the average symbol energy is $E_s=E[\|c(i)\|^2]=2A^2$, double that of BPSK, but with the same energy per transmitted bit as BPSK.

8-PSK has constellation points $$c(i) = A \exp\left[j\frac{\pi}{4}\left(i + \frac{1}{2}\right)\right],$$

for i=0, 1, ..., 7. This constellation is shown in FIG. 1C. In general, M-PSK has constellation points $$c(i) = A\exp\left[j\frac{2\pi}{M}\left(i+\frac{1}{2}\right)\right],$$

for i=0, 1, ..., M−1. The average symbol energy is $E_s=E[\|c(i)\|^2]=A^2$.

16-APSK is a standard of the second generation Digital Video Broadcast for Satellites. It is also referred to as 12/4 APSK or 12/4 QAM. It consists of the union of amplitude-scaled QPSK and 12-PSK signal constellations as shown in Eq. 1 below and the constellation shown in FIG. 1D.

$$c(i) = \begin{cases} r_1\exp\left[j\frac{\pi}{2}\left(i+\frac{1}{2}\right)\right] & i=0,1,2,3 \\ r_2\exp\left[j\frac{\pi}{6}\left(i+\frac{1}{2}\right)\right] & i=4,5,\ldots,15 \end{cases} \quad \text{Eq. 1}$$

The DVB-S2 standard defines the ratio $r_2/r_1$=3.15, 2.85, 2.75, 2.70, 2.60, and 2.57 for code rates ⅔, ¾, ⅘, ⅚, ⅚, and 9/10, respectively. The DVB-S2 standard does not specify use of a rate ½ code with 16-APSK; for the simulations described herein, $r_2/r_1$=3.15 when a rate ½ code is used. The average symbol energy is $E=E[\|c(i)\|^2]=(r_1^2+3r_2^2)/4$.

FIG. 2 shows the required $E_b/N_0$ to achieve CWER=$10^{-3}$ for r=½, k=1024 AR4JA coded 16-APSK, as a function of the outer-to-inner ring ratio $r_2/r_1$. Although there is variation, the sensitivity is quite small. The optimal ratio for this coded modulation combination is about 3.15. For code-modulation combinations specified by DVB-S2, the simulations reported herein used the standard ratios. For rate modulation combinations not in the DVB-S2 standard, the ratios were first optimized using data as shown in FIG. 2, and then subsequent simulations were run with the optimized ratios.

32-APSK is also a DVB-S2 standard. It is the union of three PSK constellations as shown in Eq. 2 below and the constellation shown in FIG. 1E $$c(i) = \begin{cases} r_1\exp\left[j\frac{\pi}{2}\left(i+\frac{1}{2}\right)\right] & i=0,1,2,3 \\ r_2\exp\left[j\frac{\pi}{6}\left(i-4+\frac{1}{2}\right)\right] & i=4,5,\ldots,15 \\ r_1\exp\left[j\frac{\pi}{8}i\right] & i=16,17,\ldots,31 \end{cases} \quad \text{Eq. 2}$$

The DVB-S2 standard defines the ratios $r_2/r_1$=2.84, 2.72, 2.64, 2.54, and 2.53, and $r_3/r_1$=5.27, 4.87, 4.64, 4.33, and 4.30 for code rates ¾, ⅘, ⅚, ⅚, and 9/10, respectively. The DVB-S2 standard does not specify use of rate ½ or ⅔ codes with 32-APSK; for the simulations described herein, $r_2/r_1$=4.0 and 3.15 and $r_3/r_1$=8.0 and 6.25 are used when rate ½ and ⅔ codes, respectively, are used. The average symbol energy is $E_s=E[\|c(i)\|^2]=(r_1^2+3r_2^2+4r_3^2)/8$.

Encoded bits are assigned to a sequence of corresponding complex constellation points, or modulation symbols. Each of the modulations considered in this disclosure has a number of constellation points that is a power of two, which makes such bit-to-symbol mappings straightforward.

The signal constellations described above define a natural binary ordering. For example, the 8-PSK constellation points indexed by i=0, 1, 2, 3, 4, 5, 6, and 7 correspond to the 3-bit patterns 000, 001, 010, 011, 100, 101, 110, and 111, respectively. This may be referred to as the natural bit-to-symbol mapping for the modulation. Note that the natural ordering, or any other, is dependent on the way the constellation points happen to be indexed which, in principle, is arbitrary.

Other mappings, such as Gray codes, can often give better performance. Note that a Gray code may be more properly referred to as a Gray labeling. A code's word error rate performance is not dependent on the order of indexing, whereas with a Gray labeling, the whole point is that it is defined in a particular order. There are many Gray codes with the defining property that adjacent members in the list differ in exactly one bit in their binary representation, some with slightly different performance than others. In the simulations discussed herein, the binary reflected Gray code is used, which has recently been proven to be the optimal Gray code for M-PSK modulations (see, for example, E. Agrell, J. Lassing, E. G. Strom, and T. Ottosson, "On the optimality of the binary reflected Gray code," IEEE Trans. Inform. Theory, 50(12):3170-3182, 2004.). The binary reflected Gray code of length M is obtained from the binary reflected Gray code of length M/2 by listing the members 0, 1, ..., M−1, each preceded by a zero, followed by the members M−1, M−2, ..., 0, each preceded by a one.

The binary reflected Gray code has the prefix property, i.e., a length M' Gray code's members are equal to the first M' members of a Gray code of length M, M>M'. Thus, when conducting simulations of Gray codes of various lengths, only the longest Gray code need be stored.

An anti-Gray code has the property that adjacent members in the list differ either in all their bits or in all but one of their bits. An anti-Gray code of length M can be obtained from a binary reflected Gray code of length M by removing the last M/2 entries and inserting after each of the remaining M/2 entries the ones complement of that entry. Anti-Gray codes do not have a prefix property, meaning a separate mapping should be stored for each length.

For modulations in which constellation points have more than two near neighbors, a specialized bit to symbol mapping is needed. The DVB-S2 standard specifies such a mapping to use with 16-APSK and 32-APSK.

The bit representations of the constellation points under the natural, Gray, anti-Gray, and DVB mappings are shown in FIG. 3, for lengths 2, 4, 8, 16, and 32. Note that in the Gray column, 0, 1, 3, 2, ... in binary is 00000, 00001, 00011, 00010, ..., and each subsequent constellation point has a binary representation that differs in exactly one bit, including wrapping around to the beginning. The anti-Gray column has a separate specification for each length and, for example, 0, 7, 1, 6, ..., in binary is 000, 111, 001, 110, ..., with each entry differing in either two or all three bits. In FIGS. 1A-1E, the BPSK, QPSK, and 8-PSK modulations are shown with the Gray code, and the 16-APSK and 32-APSK modulations are shown with the DVB-S2 standard mapping.

FIG. 3 gives a mapping from the constellation index i to the bit representation map(i), but, at the modulator, the inverse operation is used, to map bits to a constellation point. The inverse is defined by $c_m[\text{map}(i)]=c(i)$ for each i, where the subscript m indicates that the constellation has been mapped to a new ordering. For example, to map "1000" to a constellation point using the Gray code, note that "1000" is 8 in decimal, and $c_m[8]=c(15)$ is the corresponding constellation point.

FIG. 4 shows the performance of the r=½, k=1024 AR4JA code with 8-PSK when the bit-to-symbol mapping is Gray, natural, and anti-Gray. At BER=$10^{-6}$, a natural mapping incurs a loss of 2.8 dB compared to the Gray code, and an anti-Gray code incurs a loss of 4.1 dB compared to the Gray code. It is important for system designers, therefore, to use a Gray mapping when using LDPC codes and higher order modulations.

As discussed above in regard to FIG. 24, noise may be modeled in a communication channel as being additive. To isolate the coded modulation performance from other effects, an additive white Gaussian noise (AWGN) channel with no Doppler, fading, or other channel impairments, no amplifier distortions, and perfect receiver synchronization of carrier frequency, phase, and timing is assumed herein.

The passband signal is assumed to be of the form shown in Eq. 3 below:

$$s(t)=a(t)\cos(2\pi f_c t+\theta(t)) \qquad \text{Eq. 3}$$

where $f_c$ is the carrier frequency in Hz, and $a(t)$ and $\theta(t)$ are arbitrary modulation-dependent signals. Eq. 3 may be rewritten as shown in Eq. 4 below:

$$s(t)=Re\{\tilde{s}(t)e^{j2\pi f_c t}\} \qquad \text{Eq. 4}$$

where $\tilde{s}(t)=a(t)e^{j\theta(t)}$ is the complex baseband representation of $s(t)$. Eq. 5 below presents an alternative expression for $\tilde{s}(t)$:

$$\tilde{s}(t)=\sqrt{P_c}+\tilde{m}(t) \qquad \text{Eq. 5}$$

where $\sqrt{P_c}$ is an unmodulated residual carrier signal with complex baseband power $P_c$, and $\tilde{m}(t)$ is a complex baseband modulation with complex baseband power $$P_d = \lim_{T \to \infty} \frac{1}{T} \int_0^T \tilde{m}^2(t)dt.$$

This can be put back in passband notation using Eq. 4, from which the residual carrier signal term $\sqrt{P_c}\cos(2\pi f_c t)$ is readily apparent. The modulations discussed herein have the form shown in Eq. 6 below:

$$\tilde{m}(t) = \sum_{i=-\infty}^{\infty} m[i]p(t-iT) \qquad \text{Eq. 6}$$

where $m[i]$ is a member of a signal constellation $m[i] \in C=\{c(0), c(1), \ldots, c(M-1)\}$ in the complex plane, and where $p(t)$ is a square pulse shape of symbol duration T as shown in Eq. 7 below:

$$p(t) = \begin{cases} 1 & \text{if } 0 \le t < T \\ 0 & \text{otherwise} \end{cases} \qquad \text{Eq. 7}$$

For the purposes of this disclosure, the residual carrier signal can be assumed to have been filtered out of the modulated received signal or, equivalently, $P_c=0$. Thus, the received modulated complex baseband signal is of the form shown in Eq. 8 below:

$$\tilde{r}(t)=\tilde{m}(t)+\tilde{n}(t) \qquad \text{Eq. 8}$$

where $\tilde{n}(t)$ is a complex baseband Gaussian noise process with one-sided power-spectral density $N_0$ in each dimension. As the receiver, $\tilde{r}(t)$ is put through a perfect matched filter, which results in complex soft symbols as shown in Eq. 9 below:

$$r[i]=m[i]+n[i] \qquad \text{Eq. 9}$$

where $n[i]$ is a complex Gaussian random variable with variance $\sigma^2$ in each of its real and imaginary components.

The performance of the AR4JA LDPC codes on a binary-input additive white Gaussian noise (AWGN) channel is well-documented (see, for example, "The development of turbo and LDPC codes for deep-space applications," and "Low density parity check codes for use in near-Earth and deep space," cited above). Such published performance results apply to binary phase-shift keying (BPSK) or quadrature PSK (QPSK) modulation, as is typically used in deep space missions. When bandwidth is constrained, however, system engineers may also desire to know the performance of LDPC codes when used with higher order modulations, in order to most effectively trade off power efficiency, bandwidth efficiency, and complexity. The need for bandwidth-efficient higher order modulations will become more pressing in the future as NASA and other space agencies utilize higher data rates and more simultaneous missions in the same limited spectrum. Modern variable coded modulation (VCM) or adaptive coded modulation (ACM) schemes will be able to switch between the different coded modulations as power and bandwidth resources vary.

Therefore, it is helpful to assess the performance of the standard LDPC codes when used with higher order modulations such as 8-PSK, 16-ary amplitude PSK (16-APSK), and 32-APSK. The performance of rate ⅘ AR4JA codes used with BPSK, 8-PSK, and 16-APSK has been previously reported (see M. Cheng, D. Divsalar, and S. Duy "Structured low-density parity-check codes with bandwidth efficient modulation," In *Proceedings of SPIE Conference on Defense Security and Sensing*, April 2009). For other combinations of codes and modulations, performance may be estimated based on the concept of code imperfectness. First, the code imperfectness of the code when used with BPSK is determined by measuring the difference between the code's required bit signal to noise ratio $E_b/N_0$ to attain a given codeword error rate (CWER) and the minimum possible $E_b/N_0$ required to attain the same CWER as implied by the sphere-packing bounds for codes with the same block size k and code rate r (see S. Dolinar, D. Divsalar, and F. Pollara, "Code performance as a function of block size," *TDA Progress Report*, 42(133), May 1998). This same imperfectness is then applied with respect to the capacity of the higher order modulation to arrive at an approximated performance of the code when used with the higher order modulation. The imperfectness approximation has generally been found to be fairly accurate, to within about 0.5 dB, over a wide variety of codes and modulations.

The presence of noise in the channel makes the selection and implementation of a decoder (such as the decoder 140 shown in FIG. 24) important, since the decoder must properly recover the transmitted information in the presence of noise. Some LDPC decoder implementations may require a long time to process received data to recover transmitted information or may not be able to recover information at a desired error rate at all. Therefore, there exists a need in the art for LDPC decoder variations that can provide desired performance.

SUMMARY

Described herein are embodiments that provide for digital communication coding methods, apparatus, and systems with improved performance for decoding of LDPC coded signals. The described methods, apparatus, and systems incorporate a decoder or decoding method that decodes LDPC coded messages with a bipartite graph having check nodes and variable nodes. Messages from check nodes are partially hard limited, so that every message which would otherwise have an magnitude at or above a specified level is reassigned to an maximum magnitude, while the sign of the sign of the original message is not changed.

One aspect is a method for decoding a low-density parity-check (LDPC) coded signal transmitted in a channel, where the method comprises: receiving input messages comprising the LDPC coded signal for subsequent processing on a bipartite graph, wherein the bipartite graph comprises variable nodes and check nodes representing an LDPC code; passing messages along edges of the bipartite graph, wherein passing messages comprises iteratively passing messages from the variable nodes to the check nodes and from the check nodes to the variable nodes; assigning a maximum positive value to every message from each check node greater than or equal to a selected positive limit value; assigning a maximum negative value to every message from each check node less than or equal to a selected negative limit value; and outputting a decoded message when convergence is reached or a selected number of iterations is reached. Absolute values of the maximum positive value and minimum negative value may be equal.

Another aspect is a digital communication receiving system, wherein the digital communication receiving system is configured to receive transmissions encoded with a low-density parity-check code, and the system comprises: a demodulator, wherein the demodulator receives modulated data and outputs demodulated data; and a decoder, wherein the decoder decodes demodulated data from the demodulator to output decode data by performing several processing steps, wherein the several processing steps comprise: receiving the demodulated data as inputs to variable nodes of a bipartite graph, wherein the bipartite graph comprises variable nodes and check nodes representing the low-density parity-check code; passing messages along edges of the bipartite graph, wherein passing messages comprises iteratively passing messages from the variable nodes to the check nodes and from the check nodes to the variable nodes; assigning a maximum positive value to every message from each check node greater than or equal to a selected positive limit value; assigning a minimum negative value to every message from each check node less than or equal to a selected negative limit value; and outputting the decoded data when convergence is reached or a selected number of iterations is reached. Absolute values of the maximum positive value and minimum negative value may be equal.

Still another aspect is a method for decoding a low-density parity-check (LDPC) coded signal transmitted in a channel, where the method comprises: receiving input messages comprising the LDPC coded signal for subsequent processing on a bipartite graph, wherein the bipartite graph comprises variable nodes and check nodes representing an LDPC code; passing messages along edges of the bipartite graph, wherein passing messages comprises iteratively passing messages from the variable nodes to the check nodes and from the check nodes to the variable nodes; assigning a maximum positive value to at least one message from at least one check node greater than or equal to a selected positive limit value; assigning a minimum negative value to at least one message from at least one check node less than or equal to a selected negative limit value; and outputting a decoded message when convergence is reached or a selected number of iterations is reached. Absolute values of the maximum positive value and minimum negative value may be equal.

The details of one or more exemplary embodiments are set forth in the accompanying drawings and description below. Other features, objects, and advantages will be apparent from the description and drawings, and from the claims.

DETAILED DESCRIPTION

Figure 1A:
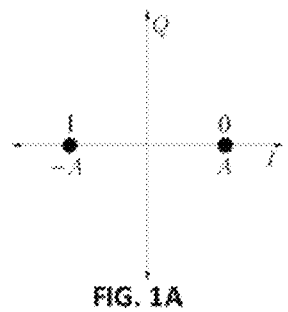
FIGS. 1A-1E show the signal constellations of various modulations.

As described below, embodiments of the present invention provide for improved decoding performance at lower signal-to-noise ratios. The improved decoding performance is provided at various modulations and with various demodulation approaches. The description below presents the performance of other known decoding methods to establish the improvement provided by embodiments of the present invention. Simulation results for combinations of the nine AR4JA LDPC codes and five modulations discussed above are presented below to provide estimates of the expected performance of these codes using known decoding approaches and embodiments according to the present invention. Provided below is the simulated performance of parameters such as code rates and lengths and modulations, for different combinations of codes and modulations, along with some combinations of mappings, demodulator structures, and number of decoder iterations.

As described above, LDPC systems may utilize various modulation types and various bit-to-modulation-symbol mappings. To aid in understanding the invention, a derivation of associated log likelihood ratios (LLRs) that apply to the various modulation types and bit mappings is presented below. One of the simple and well-performing LLR approximations can be expressed in a general equation that applies to all of the modulation types.

A demodulator (such as the demodulator 130 shown in FIG. 24) may form a log likelihood ratio (LLR) as part of demodulation. Soft decision decoders take as input the LLR for each code bit (see, for example, M. Cheng, D. Divsalar, and S. Duy, "Structured low-density parity-check codes with bandwidth efficient modulation," in *Proceedings of SPIE Conference on Defense Security and Sensing*, April 2009). Suppose bits $b=b_{m-1}, b_{m-2}, \ldots, b_0$ are mapped to the complex constellation point $c=c(b)$. Note, the subscript m has been dropped for notational convenience, and assume $c(\cdot)$ itself specifies the correct order of symbols for the desired mapping. Let $r=c+n$ denote the noisy received symbol.

As discussed below, the exact LLR expression for an arbitrary constellation is derived, and a lower-complexity approximate LLR expression based on nearest neighbors to the received point and the LLR expressions specific to BPSK, QPSK, 8-PSK, 16-APSK, and 32-APSK are provided.

The LLR for the jth bit of the symbol is shown in Eq. 10 below:

$$\lambda_j \triangleq \ln\left[\frac{P(b_j=0|r)}{P(b_j=1|r)}\right] \quad \text{Eq. 10}$$

$$= \ln\left[\frac{p(r|b_j=0)P(b_j=0)/p(r)}{p(r|b_j=0)P(b_j=1)/p(r)}\right]$$

$$= \ln\left[\frac{p(r|b_j=0)}{p(r|b_j=1)}\right]$$

where P is used to indicate a probability and p to indicate a probability density function (pdf). Also, Bayes's rule for a mixture of probabilities and pdfs was applied and, in the last step, $p(b_j=0)=P(b_j=1)=\frac{1}{2}$ is assumed.

For $i \in \{0,1\}$, the pdf may be found as shown in Eqs. 11-13 below:

$$p(r|b_j=i) = \sum_{b:b_j=i} p(r|b) \quad \text{Eq. 11}$$

$$= \sum_{b:b_j=i} p(r-c(b)) \quad \text{Eq. 12}$$

$$= \sum_{b:b_j=i} \frac{\exp\left(-\frac{\|r-c(b)\|^2}{2\sigma^2}\right)}{2\pi\sigma^2} \quad \text{Eq. 13}$$

where Eq. 11 follows because it is a sum of disjoint events, and Eq. 13 is the pdf of a complex Gaussian random variable with variance $\sigma^2$ in each of its real and imaginary components.

Substituting into Eq. 10, Eq. 14 is obtained:

$$\lambda_j = \ln\left[\frac{\sum_{b:b_j=0} \exp\left(-\frac{\|r-c(b)\|^2}{2\sigma^2}\right)}{\sum_{b:b_j=1} \exp\left(-\frac{\|r-c(b)\|^2}{2\sigma^2}\right)}\right] \quad \text{Eq. 14}$$

Thus, to compute the jth bit LLR from r, one may compute the squared distance to each of the constellation points, separating those constellation points that have a 0 in bit j from those that have a 1, and using Eq. 14.

The relation shown below in Eq. 15 may be used in Eq. 14:

$$\|r-c\|^2 = \|r\|^2 - 2\langle r,c\rangle + \|c\|^2 \quad \text{Eq. 15}$$

where the inner product is $\langle r,c\rangle \triangleq \text{Re}\{r\}\times\text{Re}\{c\}+\text{Im}\{r\}\times\text{Im}\{c\}$.

When the modulation has symbols each of the same energy, as is the case for PSK modulations, the $\|r\|^2$ and $\|c\|^2$ terms in the numerator and denominator cancel and the simpler form shown in Eq. 16 is obtained:

$$\lambda_j = \ln\left[\frac{\sum_{b:b_j=0} \exp\left(\frac{\langle r,c(b)\rangle}{\sigma^2}\right)}{\sum_{b:b_j=1} \exp\left(\frac{\langle r,c(b)\rangle}{\sigma^2}\right)}\right] \quad \text{Eq. 16}$$

A common approximation to the LLR is to replace each sum in Eq. 14 by its largest term, i.e., by using only the nearest constellation point that has $b_j=0$ in the numerator, and the nearest neighbor that has $b_j=1$ in the denominator. If these nearest neighbor constellation points are denoted as shown in Eq. 17 below:

$$c^*(j,i) \triangleq c(\text{argmin}_{b:b_j=i}\|r-c(b)\|^2), \quad \text{Eq. 17}$$

i∈{0,1}, then Eq. 16 may be approximated as shown below:

$$\lambda_j \approx \ln\left[\frac{\exp\left(-\frac{\|r-c^*(j,0)\|^2}{2\sigma^2}\right)}{\exp\left(-\frac{\|r-c^*(j,1)\|^2}{2\sigma^2}\right)}\right] \quad \text{Eq. 18}$$

$$= \frac{1}{2\sigma^2}(\|r-c^*(j,1)\|^2 - \|r-c^*(j,0)\|^2)$$

$$= (2\langle r, c^*(j,0)-c^*(j,1)\rangle + \|c^*(j,1)\|^2 - \|c^*(j,0)\|^2) \quad \text{Eq. 19}$$

For equal energy signal constellations, Eq. 19 may be approximated as shown in Eq. 20 below:

$$\lambda_j \approx \frac{\langle r, c^*(j,0)-c^*(j,1)\rangle}{\sigma^2} \quad \text{Eq. 20}$$

This requires one subtraction and two multiplications. The step of dividing by $\sigma^2$ can be eliminated if a remains constant over many symbols, by precomputing $c(i)/\sigma^2$ for each i.

Figure 5:
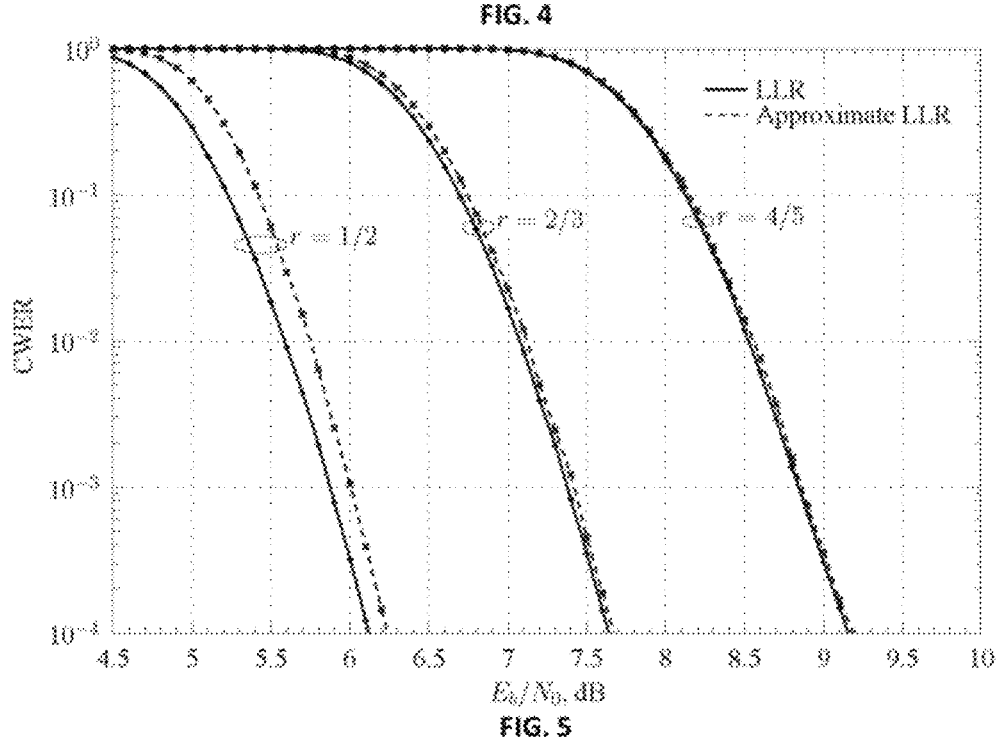
FIG. 5 shows a comparison of LLR and approximate LLR decoder performance for AR4JA LDPC coded 32-APSK with $k=1024$, and $r=\frac{1}{2}$, $\frac{2}{3}$, and $\frac{4}{5}$.

FIG. 5 shows the codeword error rate (CWER) performance of the decoder when using the exact LLR shown in Eq. 16 and the nearest neighbor approximation in shown in Eq. 19. The results shown are for 32-APSK with AR4JA LDPC codes of length k=1024 and rates r=½, ⅔, and ⅘. As can be seen, the approximate LLR leads to about 0.1 dB of loss for r=½, and 0 to 0.05 dB of loss for rates ⅔ and ⅘. This justifies using the approximate LLR in an implementation. Nevertheless, in all other simulation results described in this disclosure, the exact LLR is used because the demodulator complexity is small compared to the decoder complexity, and thus the simulation time is not substantially increased by using the exact demodulator.

The LLR for hard decisions produced by the demodulator will differ from the LLR for soft decisions. When the demodulator produces hard decisions, the decoder does not have access to r, and therefore cannot compute $\lambda_j$ as in Eq. 14. Instead, the decoder only is told whether $b_j$ is more probably a 1 or a 0, i.e., whether $\lambda_j \leq 0$ or $\lambda_j > 0$, respectively. That is, the hard decision decoder is given $\text{sgn}(\lambda_j)$.

Because the decoder operates on LLRs, a hard decision LLR may be defined as shown below in Eq. 21:

$$\lambda_j^{(H)} \triangleq \ln\left[\frac{P(b_j=0|\text{sgn}(\lambda_j))}{P(b_j=1|\text{sgn}(\lambda_j))}\right] \quad \text{Eq. 21}$$

$$= \ln\left[\frac{p(\text{sgn}(\lambda_j)|b_j=0)}{p(\text{sgn}(\lambda_j)|b_j=1)}\right]$$

$$= \text{sgn}(\lambda_j)\cdot\ln\left[\frac{1-p}{p}\right]$$

where p is the probability that the hard decision is incorrect. For BPSK, $p=Q(\sqrt{2E_s/N_0})$, where:

$$Q(x) = \int_x^\infty \frac{1}{\sqrt{2\pi}}e^{-x^2/2}\,dx.$$

Note that computation of $\lambda_j^{(H)}$ requires knowledge of $E_s/N_0$. The receiver typically makes an estimation of this, but if this estimate is not available, there would be an additional decoder implementation loss.

The LLR discussion above was for an arbitrary modulation constellation. For BPSK modulation, there are only two constellation points, and so the expression in Eq. 18, and hence Eq. 20, is exact. There is only one bit LLR to compute, namely, $\lambda_0$, with $c^*(0,0)=A$ and $c^*(0,1)=-A$, and the LLR is given by Eq. 22 below:

$$\lambda_0 = \frac{\langle r, c^*(j,0)-c^*(j,1)\rangle}{\sigma^2} = \frac{\langle r, 2A\rangle}{\sigma^2} = \frac{2A\text{Re}\{r\}}{\sigma^2} \quad \text{Eq. 22}$$

When a code is used with BPSK, the LLRs of the codebits are independent and identically distributed (i.i.d.), because each codebit gets mapped to its own modulation symbol, and each modulation symbol is corrupted by i.i.d. noise.

Figure 1B:
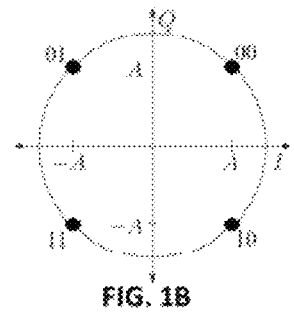

The LLR for QPSK modulation may also be derived in a similar manner. As can be seen from FIG. 1B, the least significant bit (LSB) of a Gray coded QPSK modulation depends on Re{r} in exactly the same way as for BPSK. This can be seen mathematically by noting the following relationships:

$$c(0)=A(1+j)$$

$$c(1)=A(-1+j)$$

$$c(2)=A(1-j)$$

$$c(3)=A(-1-j)$$

and then plugging these relations into Eq. 16, when then becomes Eq. 23 below $$\lambda_0 = \ln\left[\frac{\exp\left(\frac{\langle r,c(0)\rangle}{\sigma^2}\right) + \exp\left(\frac{\langle r,c(2)\rangle}{\sigma^2}\right)}{\exp\left(\frac{\langle r,c(1)\rangle}{\sigma^2}\right) + \exp\left(\frac{\langle r,c(3)\rangle}{\sigma^2}\right)}\right] \quad \text{Eq. 23}$$

Using the following relationships:

$$\langle r,c(0)\rangle = A(\text{Re}\{r\}+\text{Im}\{r\})$$

$$\langle r,c(1)\rangle = A(-\text{Re}\{r\}+\text{Im}\{r\})$$

$$\langle r,c(2)\rangle = A(\text{Re}\{r\}-\text{Im}\{r\})$$

$$\langle r,c(3)\rangle = A(-\text{Re}\{r\}-\text{Im}\{r\})$$

and plugging these into Eq. 23 and simplifying, Eq. 24 is obtained:

$$\lambda_0 = \frac{2A\text{Re}\{r\}}{\sigma^2} \quad \text{Eq. 24}$$

which is identical to Eq. 22. Following the same procedure for the most significant bit, where c(0) and c(1) are now in the numerator and c(2) and c(3) are in the denominator, the LLR is given by Eq. 24 below:

$$\lambda_1 = \frac{2A\text{Im}\{r\}}{\sigma^2} \quad \text{Eq. 25}$$

As was the case for BPSK, with coded QPSK using a Gray bit-to-symbol mapping, the LLRs of the codebits are independent and identically distributed (i.i.d.). Note, when the bit-to-symbol mapping is not a Gray code, the LLR expressions will not simplify to the expressions above, and the LLR's will not be i.i.d.

A similar approach is followed to determine the LLR for 8-PSK modulation. The three bit LLRs for each 8-PSK symbol can be computed using Eq. 16, with four terms each in the numerator and denominator. As there is no apparent simplification of this exact LLR expression, the approximate LLR computation of Eq. 20 can be used when a lower complexity computation is needed.

To identify the closest constellation point with a 0 or a 1 in the bit position of interest, one could compute the distances to all eight constellation points. This is unnecessary, however. As can be seen from FIG. 1C, if r is expressed in polar coordinates as r=the closest constellation point with LSB equal to zero is given by Eq. 26 below:

$$c^*(0,0) = \begin{cases} c(0) & \text{if } 0 \le \phi < \pi/4 \\ c(3) & \text{if } 3\pi/4 \le \phi < \pi \\ c(4) & \text{if } \pi \le \phi < 5\pi/4 \\ c(7) & \text{if } 7\pi/4 \le \phi < 2\pi \end{cases} \qquad \text{Eq. 26}$$

The computation in Eq. 26 requires only comparisons to constants, and no computation of distances. Similarly, another constellation point may be calculated as shown in Eq. 27 below:

$$c^*(0,1) = \begin{cases} c(1) & \text{if } \pi/4 \le \phi < \pi/2 \\ c(2) & \text{if } \pi/2 \le \phi < 3\pi/4 \\ c(5) & \text{if } 5\pi/4 \le \phi < 3\pi/2 \\ c(6) & \text{if } 3\pi/2 \le \phi < 7\pi/4 \end{cases} \qquad \text{Eq. 27}$$

Eq. 26 and Eq. 27 can be plugged into Eq. 20. The LLRs for the other two bits can be computed in a similar fashion.

Figure 1C:
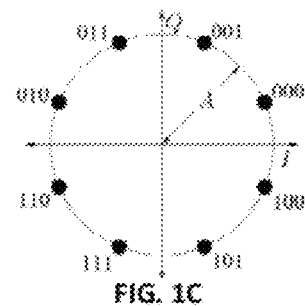
Figure 1D:
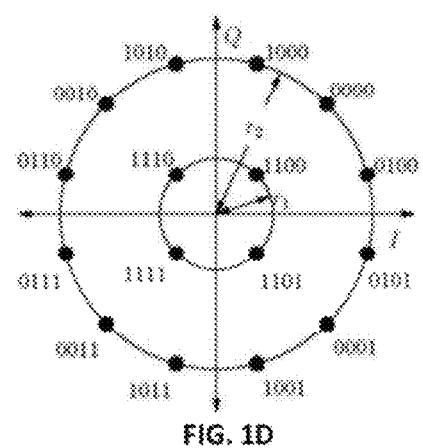
Figure 1E:
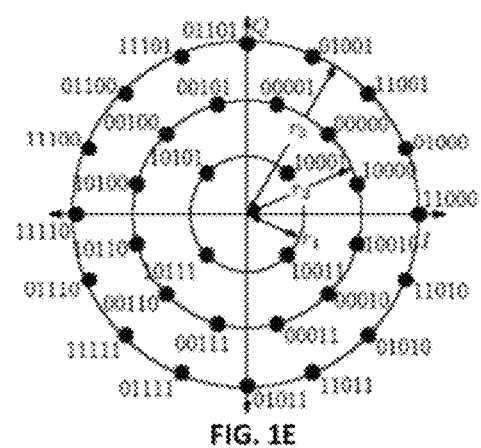
Figure 6A:
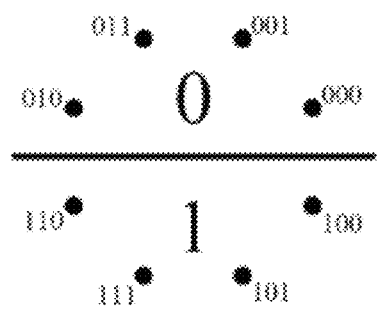
FIGS. 6A-6C show bit to symbol mapping regions for Gray-coded 8-PSK.
Figure 6B:
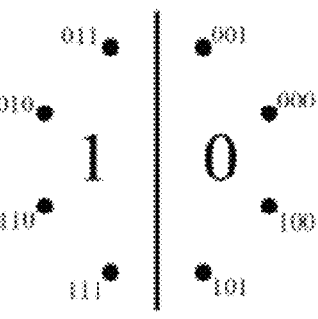
Figure 6C:
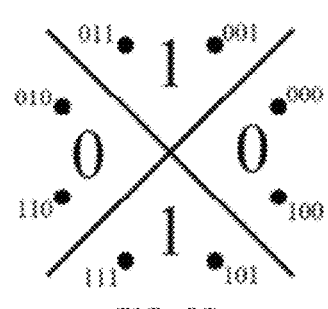

Unlike BPSK and QPSK, when higher order modulations are used, the codebit LLRs are neither independent nor identically distributed. They are not independent because noise affecting reception of an 8-PSK constellation point affects the LLRs of the three associated codebits in a correlated manner. They are not identically distributed because the distance properties are not the same with respect to each bit. For example, with Gray-coded 8-PSK as shown in FIG. 1C, the most significant bit (MSB) is '1' if the point is above the I axis and '0' otherwise. FIGS. 6A-6C shows this partition, and the partitions for the middle bit and least significant bit (LSB). FIG. 6A shows the bit to symbol mapping regions for Gray-coded 8-PSK for the MSB. FIG. 6B shows the mapping regions for the middle bit and FIG. 6C shows the mapping regions for the LSB.

Figure 7:
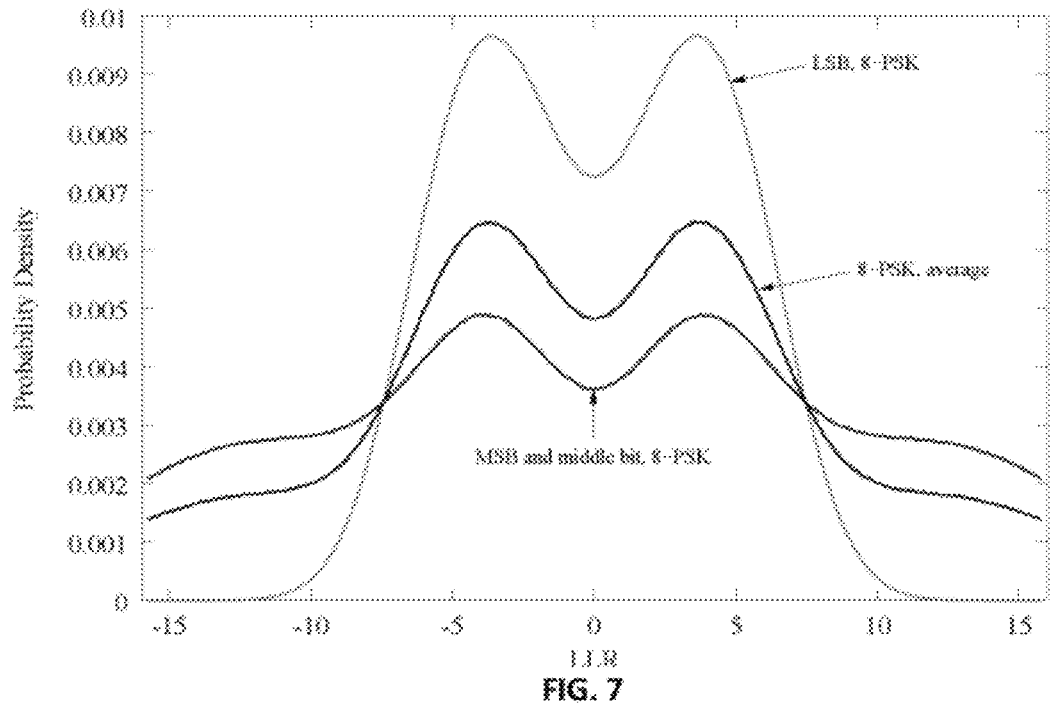
FIG. 7 is a graph of LLR distribution for the individual bits of 8-PSK.

The distance properties of the LSB are worse than those of the other two bits. As a result, the MSB and middle bit of Gray-coded 8-PSK are received, on average, with a higher absolute LLR than the LSB is. FIG. 7 shows this for k=1024, r=2/3 coded 8-PSK at $E_b/N_0$=5 dB. This SNR corresponds to CWER≈$10^{-5}$. As can be seen, the LSB is more likely to have a lower absolute LLR than the MSB or middle bits. The aggregate LLR distribution for 8-PSK is shown as well. This effect is important when considering an implementation of interleavers, which is discussed is additional detail below.

Following the techniques described above, the LLR for 16-APSK modulation can be derived. The four bit LLRs for each 16-APSK symbol can be computed using Eq. 16, with eight terms each in the numerator and denominator. As there is no apparent simplification of this exact LLR expression, the approximate LLR computation of Eq. 20 can be used when a lower complexity computation is needed.

To identify the closest constellation point with a 0 or a 1 in the bit position of interest, one could compute the distances to all sixteen constellation points. As was the case for 8-PSK, this is unnecessary. Since 16-APSK is simply the union of two PSK modulations, the angle comparison approach used for 8-PSK can be used to identify the closest inner-ring constellation point with a 0 in the bit position of interest, and separately, to identify the closest outer-ring constellation point. Then ⟨r,c⟩ can be computed for each of the two candidate constellation points to find the closer point. This requires computation of a total of four inner products, or eight multiplications, to compute an approximate bit LLR.

Figure 8:
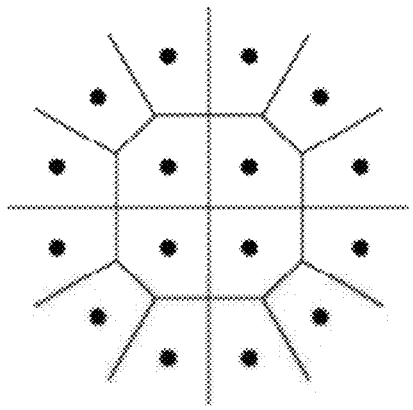
FIG. 8 shows Voronoi regions of 16-APSK.

A more careful approach can be even more efficient. The Voronoi regions of 16-APSK are shown in FIG. 8. As can be seen, the Voronoi region boundaries between the inner and outer constellation points are either horizontal, vertical, or at a 45 degree angle. Thus, a carefully crafted series of comparisons involving Re{r},Im{r}, Re{r}±Im{r}, and ϕ can identify c*(j,i) without multiplications. In this way, only comparisons and the one inner product in Eq. 20 would need to be computed.

Following the techniques described above, the LLR for 32-APSK modulation can also be derived. The five bit LLRs for each 32-APSK symbol can be computed using Eq. 16, with sixteen terms each in the numerator and denominator. As there is no apparent simplification of this exact LLR expression, the approximate LLR computation of Eq. 20 can be used when a lower complexity computation is needed. Since 32-APSK is the union of three PSK modulations, the angle comparison approach used for 8-PSK can be used to identify the closest constellation point with a 0 in the bit position of interest, on each ring. Then ⟨r,c⟩ can be computed for each of the three candidate constellation points to find the closest point. The same type of calculation is made for constellation points with a 1 in the bit position of interest. This requires computation of a total of six inner products, or twelve multiplications, to compute an approximate bit LLR.

The Voronoi boundaries of 32-APSK are not all horizontal, vertical, or at a 45 degree angle, so the more efficient method detailed above for 16-APSK could not be used for 32-APSK.

Figures 3, 24:
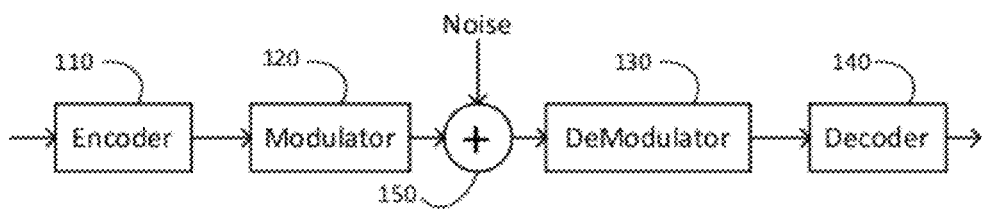
FIG. 3 shows bit representations of various modulation constellation points.
FIG. 24 shows a block diagram of a system in which LDPC encoding is used for the transmission of information.
Figure 4:
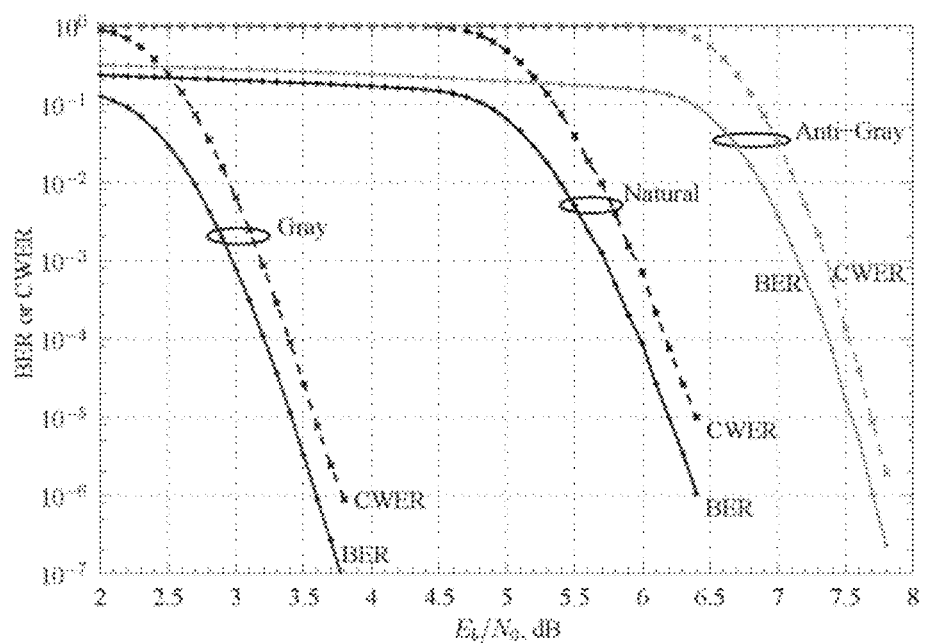
FIG. 4 is a graph of the performance of an $r=\frac{1}{2}$, $k=1024$ AR4JA code with 8-PSK using various bit-to-symbol mappings.

After the received signal is demodulated, it is provided to a decoder, such as the decoder 140 shown in FIG. 24. An LDPC code is decoded with an iterative message passing algorithm on a bipartite graph. A summary description (see, for example, K. S. Andrews, D. Divsalar, S. Dolinar, J. Hamkins, C. R. Jones, and F. Pollara, "The development of turbo and LDPC codes for deep-space applications," *Proceedings of the IEEE*, 95(11):2142-2156, November 2007.) and full derivation (see, for example, Tom Richardson and Ruediger Urbanke, *Modern Coding Theory*, Cambridge University Press, 2008.) of the decoding algorithm are available in several places in the literature. Such descriptions address the computation of appropriate conditional probabilities of maximum a posteriori (MAP) bit estimates, however, they do not typically address some of the practical aspects of decoder design, such as the quantization of the input LLRs, the finite-precision of the computations and messages being passed, complexity-reducing approximations, and subtle decoder variations. These details can have a significant impact on performance. Some of these details are discussed below.

Figure 9:
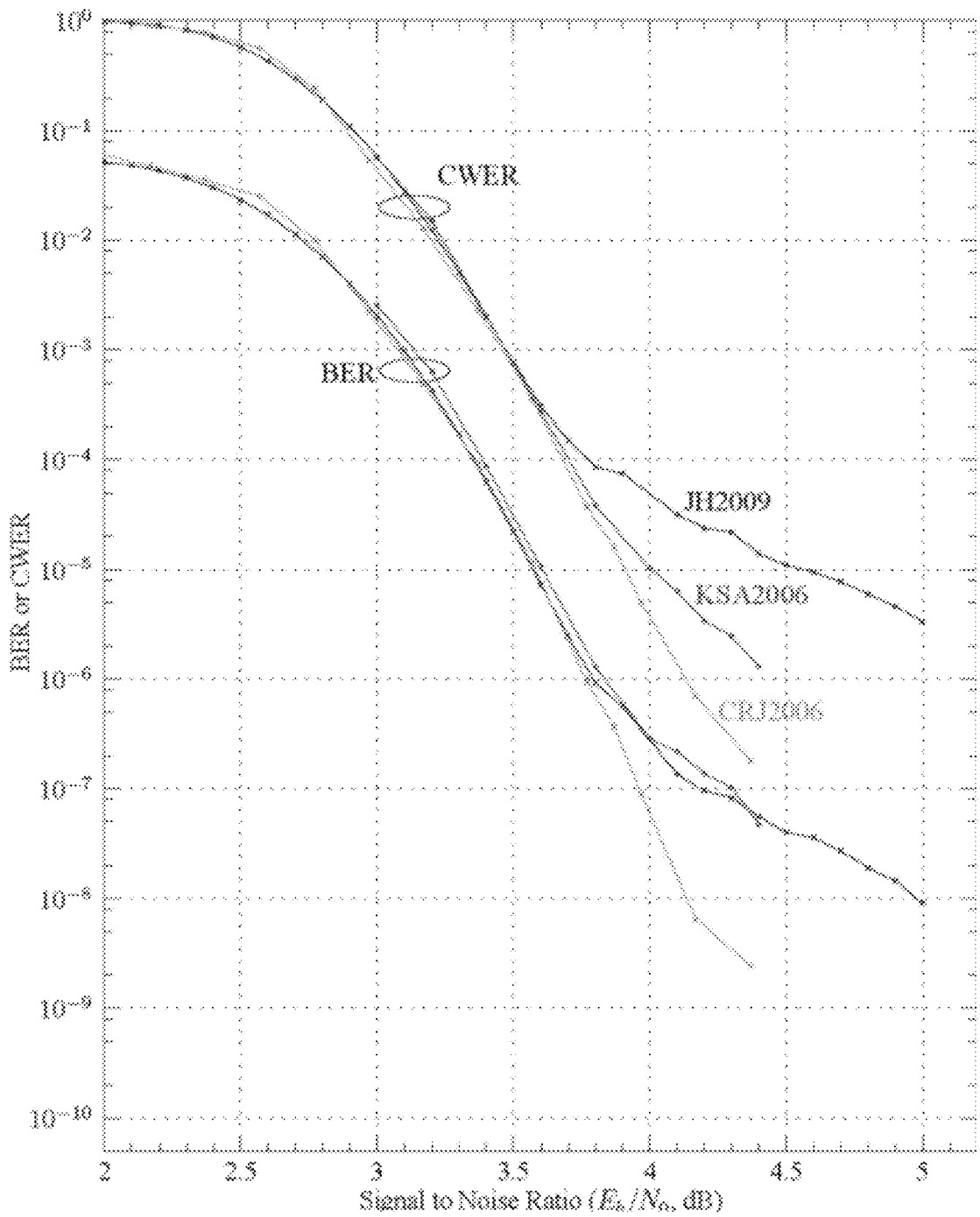
FIG. 9 is a graph of performance of selected $k=1024$, $r=\frac{4}{5}$ AR4JA decoders.

FIG. 9 is representative of the type of performance differences observed in independently developed decoders. The code illustrated is the k=1024, r=4/5 AR4JA code, with BPSK modulation. Among the CCSDS AR4JA LDPC codes, the highest error floor is usually seen on this code, so it is an instructive code to study.

As can be seen in FIG. 9, the location of the error floor is dependent on the decoder. The three decoders share several salient features—they all used 8-bit quantization and a similar min* implementation, as described in additional detail below, for example—but small differences in the decoders led to significant differences in the error floor performance. The JH2009 curve has an error floor beginning at about CWER=$10^{-4}$ and BER=$10^{-6}$, the KSA2006 curve has a floor beginning at about CWER=$10^{-5}$ and BER=$3\times10^{-7}$, and the CRJ2006 curve has no indication of a floor except possibly in its last simulated point, at about CWER=$10^{-6}$ and BER=$10^{-8}$. Another approach shows an error floor near about CWER=$10^{-7}$ and BER=$10^{-10}$.

The curve labeled as JH2009 in FIG. 9 is from a software simulation based on a decoder that is an 8-bit decoder with dynamic range (−15.875, 15.875). It uses an approximation of min* based on min minus one log correction term (with the difference not allowed to flip the sign), no special clipping of channel symbols for degree-1 variable nodes, and no "Jones clipping" at variable nodes, in which the sum of all messages into a variable node is clipped (e.g., to ±127, for an 8-bit decoder) prior to forming an outgoing message by subtracting off one of the incoming messages. The curve labeled as KSA2006 in FIG. 9 is from a simulation based on an integers-only decoder using 8 bits for channel LLRs and all messages, uniform quantization between −127/8 and +127/8, and clipping of degree-1 variable nodes to maximum magnitude 116/8. The curve labeled as CRJ2006 is from an FPGA-based decoder simulation reported in the FY2006 annual review of the IND Technology Program and in the AR4JA CCSDS Orange Book. This decoder also was an 8-bit decoder with dynamic range (−15.875, 15.875) and degree-1 clipping, and in addition it incorporated Jones clipping. It also included a number of other differences in check node processing, such as, at most two unique outgoing messages at each iteration.

Figure 10:
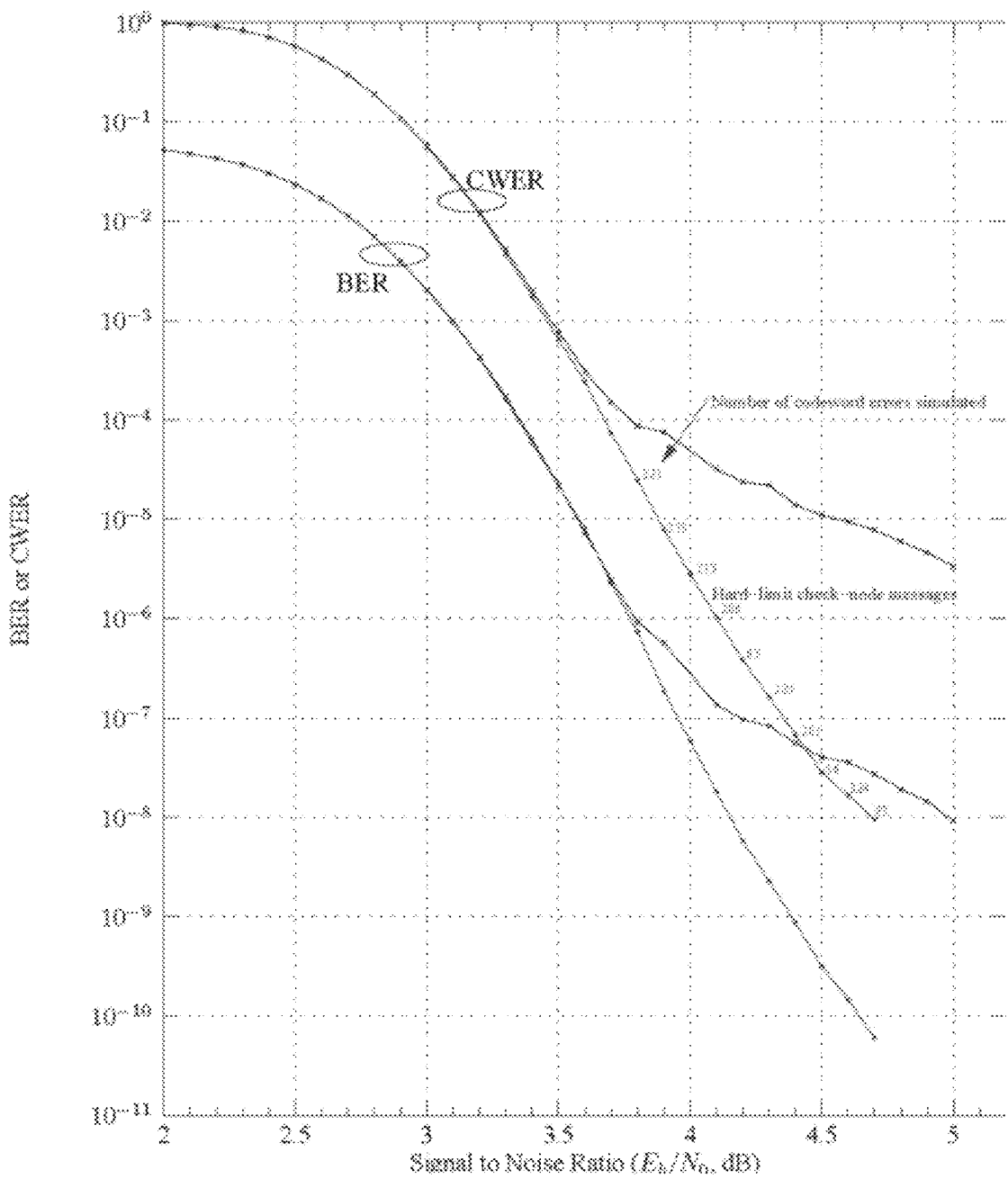
FIG. 10 is a graph of performance of a $k=1024$, $r=\frac{4}{5}$ AR4JA decoder with a lower error floor.

As described in additional detail below, embodiments of the present invention provide for optimization of decoder performance, which provides for improvements over the performance of existing decoders. After optimization, the performance can be improved to that shown in FIG. 10. The performance graphs shown in FIG. 10 were obtained from the result of a simulation of more than $8\times10^{12}$ bits. Specifically, FIG. 10 shows the performance of a (1024, 4/5) AR4JA decoder with a notably lower error floor. The various optimizations used to achieve this performance are discussed below. Note that the use of partial hard-limiting discussed below was one feature that provided the dramatically lower error floor.

Figure 11:
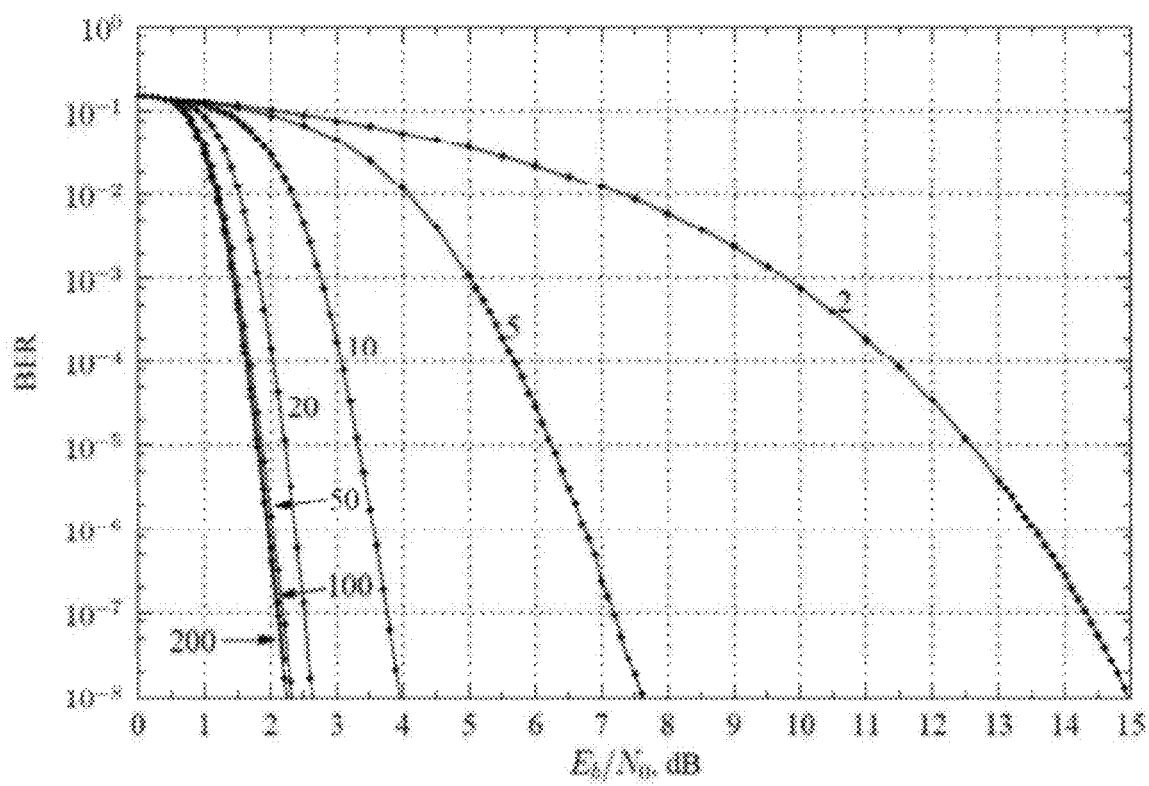
FIG. 11 is a graph of performance of a $k=1024$, $r=\frac{4}{5}$ AR4JA LDPC coded BPSK/QPSK when decoded with various maximum iterations.

The number of iterations may provide for some improvement in decoder performance. FIG. 11 shows the bit error rate (BER) performance of a decoder as a function of the number of iterations. The results shown are for the k=1024, r=½ AR4JA code used with BPSK on an AWGN channel, demodulated with an exact LLR computation quantized to 8 bits, and with a decoder limited to a maximum of 2, 5, 10, 20, 50, 100, and 200 iterations. As indicated in FIG. 11, there is not much performance improvement beyond about 50 iterations for this code. The k=4096 and k=16384 results show slightly larger performance improvement beyond 50 iterations than is the case for k=1024. Based on this, the simulations discussed in disclosure were run with a maximum of 200 iterations. When a codeword takes significantly longer than the average number of iterations to decode, incoming codewords may be buffered, and generally a buffer of 2 or 3 codewords reduces the probability of buffer overflow (or equivalently, implementation loss) to near zero. In a deployed implementation, a system engineer may trade off the implementation loss with the maximum number of iterations supported.

Quantization levels may also provide for decoder performance improvements. In a practical decoder, LLRs are represented by digital quantities. This quantization limits both the dynamic range and the resolution of the LLRs. In early experiments, it has been determined that 8 bits of quantization for the LLRs leads to a negligible loss in performance. A quantizer of the form shown in Eq. 28 below:

$$Q(x) = \begin{cases} 127 & \text{if } Cx \geq 127 \\ -127 & \text{if } Cx \leq -127 \\ \text{round}(Cx) & \text{otherwise} \end{cases} \quad \text{Eq. 28}$$

is convenient, where C is a scale factor. In this way, Q(x) takes on the integer values −127, −126, ..., 126, 127, and can be stored in an 8-bit register. This is a symmetric, uniform (equal step-size) quantizer, and for x in the granular region, Q(x)≈Cx. In the decoding algorithm, the value Q(x)/C can be used wherever x would normally be used. Note that the quantizer represents zero exactly, which is helpful to represent the LLRs of untransmitted variable nodes. It also is symmetric about zero, so that a decoder will not be biased toward either positive or negative LLRs.

Figure 12:
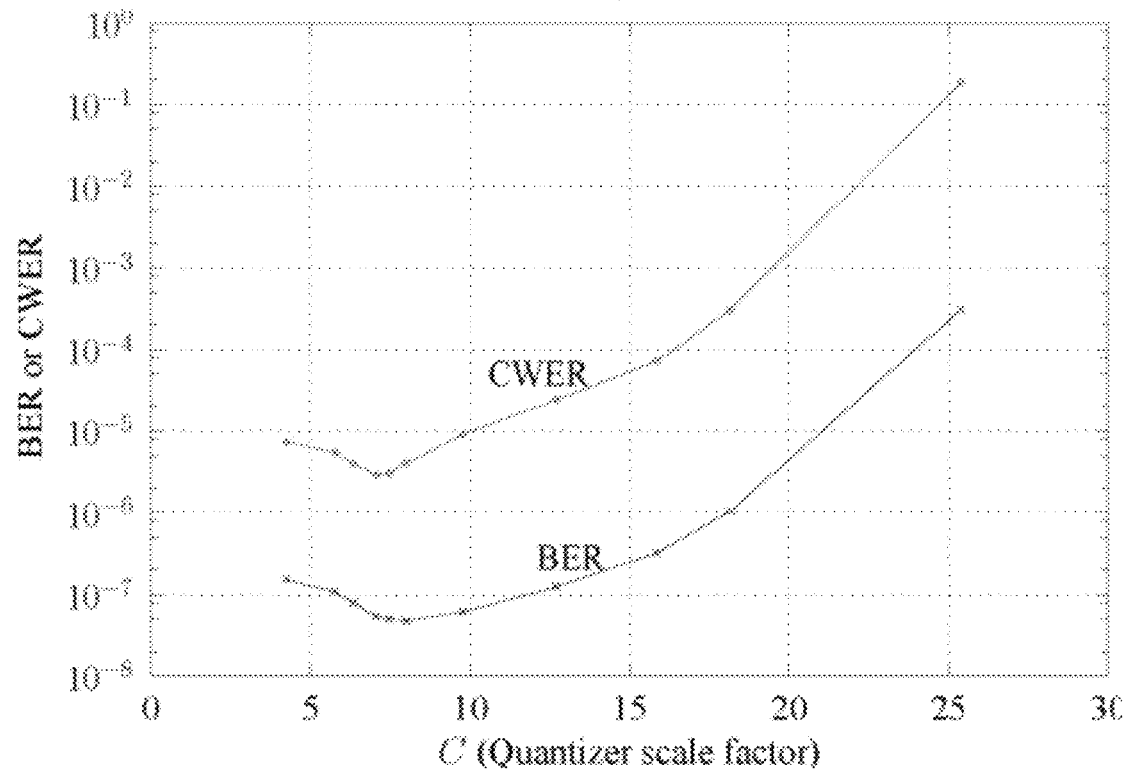
FIG. 12 is a graph of performance of an 8-bit decoder for $k=1024$, $r=\frac{4}{5}$ AR4JA code operating at $E_b/N_0=4$ dB, as a function of dynamic range of quantized LLRs.

Since the quantizer output has maximum magnitude 127, it represents LLRs in the dynamic range (−127/C, +127/C). Smaller values of C correspond to a larger dynamic range, which could aid the performance of a decoder. Given the fixed number (255) of quantizer levels, however, a larger dynamic range also means larger, coarser step size between quantizer levels. These two effects may be traded off to optimize performance. FIG. 12 shows the performance of the r=4/5, k=1024 AR4JA code operating at $E_b/N_0$=4 dB, as a function of C. As can be seen, a value of C=8 approximately optimizes performance. Hence, in the following numerical results, C=8 is used, which corresponds to a step-size of ⅛ and an LLR dynamic range of (−15⅞, +15⅞).

Handling of variable node processing may also provide for decoder performance improvements. A given variable node receives LLR messages $u_1, u_2, \ldots, u_d$ from d check nodes, where d is the degree of the variable node, along with an LLR λ from the demodulator. The message the variable node sends back to the jth of the d check nodes connected to it is given by Eq. 29 below:

$$v_j = \lambda + \sum_{\substack{i=1 \\ i \neq j}}^{d} u_i \quad \text{Eq. 29}$$

Given quantized inputs Q(λ) and Q($u_i$), which as described above are about 8 times their true LLR values and are clipped to ±127, the outgoing quantized message may be computed as shown in Eq. 30 below:

$$Q(v_j) = \text{clip}\left(Q(\lambda) + \sum_{\substack{i=1 \\ i \neq j}}^{d} Q(u_i)\right) \quad \text{Eq. 30}$$

where $$\text{clip}(x) = \begin{cases} 127 & \text{if } x \geq 127 \\ -127 & \text{if } x \leq -127 \\ x & \text{otherwise} \end{cases} \quad \text{Eq. 31}$$

Eq. 30 may also be written as Eq. 32 below:

$$Q(v_i) = \text{clip}(U - u_j) \qquad \text{Eq. 32}$$

where $U \triangleq Q(\lambda) + \sum_{i=1}^{d} Q(u_i)$. This form is convenient because each of the outgoing messages $v_1, \ldots, v_d$ can be computed from U with a single subtraction.

In an early FPGA LDPC decoder implementation reported in the literature, U was clipped prior to the subtraction as shown by Eq. 33 below:

$$Q(v_j) = \text{clip}(\text{clip}(U) - u_j) \qquad \text{Eq. 33}$$

Intuitively, this clipping, herein referred to as "Jones clipping," seems undesirable because, for example, if all of the incoming messages are large, including $u_j$, then the outgoing message will be near zero. Without the clipping of U, the message $Q(v_j)$ would be large, as is intuitively desirable.

Despite the intuition about the detrimental effect of this "Jones clipping," it turns out that the overall effect is to improve performance because such clipping apparently helps the decoder dig itself out of trapping sets in which it otherwise would get stuck. The effect may be analogous to simulated annealing, in which the algorithm occasionally moves in the opposite direction of the gradient in order to dig itself out of a local minimum. A solid theoretical understanding of this is lacking, however.

Figure 13:
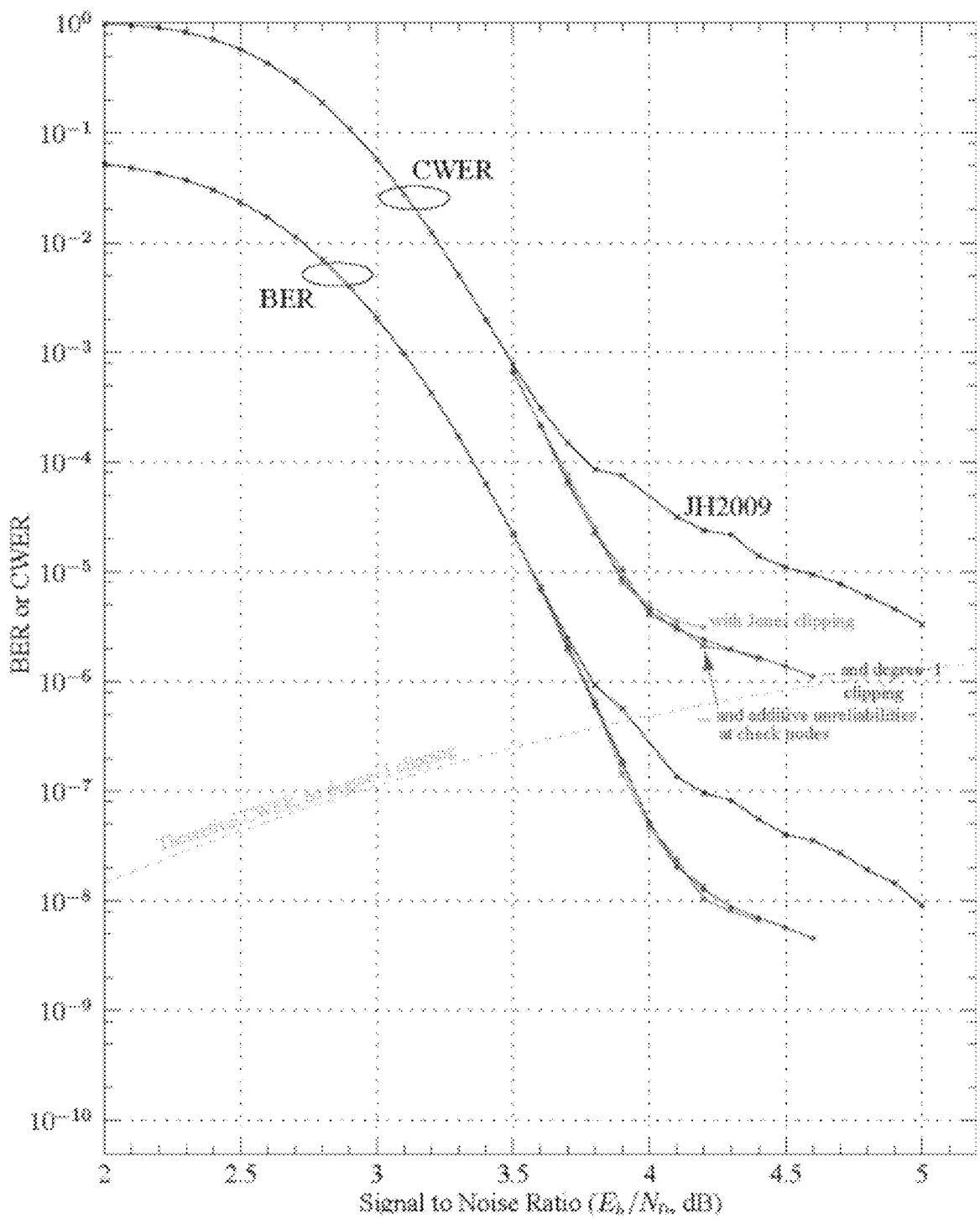
FIG. 13 is a graph of performance of a few $k=1024$, $r=\frac{4}{5}$ AR4JA decoder variants.

The performance improvement can be seen in the curve labeled "with Jones clipping" in FIG. 13. The top CWER curve is a nominal 8-bit decoder, and shows an error floor beginning at about CWER=$10^{-4}$. Introducing Jones clipping reduced the error floor by one decade, to about CWER=$10^{-5}$. As is described in additional detail below, this reduced-floor performance can be improved even more by carefully utilizing additional optimizations.

When channel symbol LLRs for degree-1 variable nodes are not clipped to levels below the maximum magnitude of check node messages, an error floor results. The reason for the floor is that a strong but wrong channel symbol LLR is not able to be overcome by the single message from the check node. For the (1024,4/5) code with 128 degree-1 variable nodes, channel symbol LLRs clipped to ±15.875, and a decoder with maximum check node message 15.125, the theoretical floor, $128Q((4E_s/N_0+15.125)/\sqrt{8E_s/N_0})$, is shown as the lower curve in FIG. 13. The theoretical floor reaches a maximum of approximately $2.4 \times 10^{-6}$ at $E_b/N_0 \approx 6.7$ dB, and then trends lower at higher SNR.

Altering the decoder to clip degree-1 variable nodes to 116/8=14.5 made little difference in the error floor, as seen in the curve labeled "degree-1 clipping" in FIG. 13, because the degree-1 problem was not the dominant flooring effect in this decoder in the region simulated.

A given check node receives messages $v_1, v_2, \ldots, v_d$ from d variable nodes, where d is the degree of the check node. The message the check node sends back to the jth of the d variable nodes connected to it is given by Eq. 34 below:

$$u_j = 2\tanh^{-1}\left(\prod_{\substack{i=1 \\ i \neq j}}^{d} \tanh\frac{v_i}{2}\right) \qquad \text{Eq. 34}$$

This can be computed by repetitively applying the function as shown below in Eqs. 35 and 36:

$$\min{}^*(x, y) \triangleq 2\tanh^{-1}\left[\tanh\left(\frac{x}{2}\right)\tanh\left(\frac{y}{2}\right)\right] \qquad \text{Eq. 35}$$

$$= \text{sgn}(xy)\left[\begin{array}{l}\min(|x|, |y|) - \ln(1 + e^{-(||x|-|y||)}) + \\ \ln(1 + e^{-(|x|+|y|)})\end{array}\right] \qquad \text{Eq. 36}$$

The second ln term of min* is smaller than the first, and can be ignored. The first ln term can be quantized using the approximation shown in Eq. 37 below:

$$\ln(1 + e^{-||x|-|y||}) \approx \frac{1}{8}\text{round}[8\ln(1 + e^{-||x|-|y||})]. \qquad \text{Eq. 37}$$

With quantized inputs Q(x)/8 and Q(y)/8 in place of x and y, this is nonzero only when $||Q(x)|-|Q(y)|| \leq 21$, so a length 22 look-up table can implement this approximation. Thus, the entire min* approximation can be computed with a few comparisons, one subtraction, and no multiplications, logarithms, or exponentials.

In some implementations, such as a software decoder on a standard desktop, it is efficient to replace the comparisons, small look-up table, and subtraction with a single look-up table. With the 8-bit quantized values, an unsigned min* table has 128×128=16384 1-byte entries, and a signed min* table has 256×256=65536 1-byte entries, which is within the reach of typical computing platforms.

When a full look-up table is used for min*, there is no need to use an approximation as in Eq. 36. Instead the table can simply contain the entries shown in Eq. 38 below:

$$Q(\min{}^*(Q(x), Q(y))) = Q\left\{2\tanh^{-1}\left[\tanh\left(\frac{Q(x)}{2c}\right)\tanh\left(\frac{Q(y)}{2c}\right)\right]\right\} \qquad \text{Eq. 38}$$

which can be conveniently computed once, ahead of time. This is equivalent to Eq. 34, using quantized inputs. Note, using the approximation shown in Eq. 37 for both log terms of Eq. 36 is not equivalent to Eq. 38, because Eq. 37 quantizes the log term separately, introducing quantization noise twice, whereas Eq. 38 does not quantize until the end of the full computation.

Nevertheless, this more exact min* computation made no discernible difference in the simulated error floor.

The rate 4/5 AR4JA codes have degree-18 check nodes. To compute a min* function of 17 variables, multiple 2-input min* functions are repeatedly computed, using a tree-structure. Since each min* involves quantization noise, the total quantization noise for the min* with 17 variables could be significant. As an alternative, each reliability message $v_i$ from a variable node can be transformed to an unreliability $\Psi(v_i) = \ln(\tan h(v_i))$, so that the product in Eq. 34 becomes a summation as shown in Eq. 39 below:

$$u_j = \Psi\left(\sum_{\substack{i=1 \\ i \neq j}}^{d} \Psi(v_i)\right) \qquad \text{Eq. 39}$$

Note that $\Psi(\bullet)$ is a self-inverse function. With quantized inputs and outputs, Eq. 39 becomes Eq. 40 as shown below:

$$Q(u_j) = Q\left[\Psi\left(\sum_{\substack{i=1\\i\neq j}}^{d} \Psi\left(\frac{Q(v_j)}{C}\right)\right)\right] \quad \text{Eq. 40}$$

In this form, the addition can be performed without introducing quantization noise beyond that present in the inputs, and the result is transformed back to a reliability and re-quantized only at the end of the computation. The overall quantization noise is less using this method. This alteration had no discernible effect on error-floor performance, as seen in the curve marked as having "additive unreliabilities at check nodes" in FIG. 13. Since this optimization also led to a slower software, it was not used in the numerical in the remainder of this disclosure.

One additional decoder variation made a big difference in the error floor performance. Messages from each check node were partially hard-limited, so that every message from a check node which would otherwise have a quantized magnitude at least 100 was re-assigned to have maximum magnitude (127) (i.e., positive messages greater than or equal value +100 were re-assigned to a value of +127 and negative messages less than or equal value −100 were re-assigned to a value of −127). This resulted in the performance shown by curve marked as having "hard-limit check node messages" in FIG. 10. In this decoder implementation, messages are "limited" to values between a positive limit and a negative limit or are set to maximum positive or negative values. As can be seen, the floor was reduced to about CWER=3×10$^{-8}$ and BER=3×10$^{-10}$ with no loss in the waterfall region. The average number of iterations in the waterfall region is the same as for the JH2009 decoder, so this decoder is a promising candidate for low-complexity error-floor mitigation.

As noted, the check-node hard-limiter helps improve performance for the reasons discussed below. The lower floor means that the decoder is handling trapping sets better than the JH2009 decoder. Consider a trapping set V of incorrectly converged variable nodes, with a set C of neighboring check nodes, each connected to V an odd number of times (i.e., a (|V|, |C|) trapping set). The check nodes in C are unsatisfied. In general, a node of V may receive messages from nodes in C and nodes not in C. If the decoder is stuck in the trapping set, the (correct) messages from nodes in C are not powerful enough to overcome the (incorrect) messages from nodes not in C. Because of how C is connected to V, the messages from check nodes in C tend to start converging slightly faster than those not in C. By hard-limiting the messages from all check nodes above 100, the unsatisfied checks are able to more quickly correct incorrect nodes in V. The interaction of Jones clipping with the partial hard-limiter may also be important.

Various other damping, amplifying, optimal processing of cycles, and iterative demodulation decoding may also be incorporated. These may lead to additional performance improvements.

Software was written in C to implement the encoder, bit-mapper, modulator, noise generator, demodulator, LLR computation, and decoder for each combination of code, modulation, bit-mapping type, and demodulation type set forth in Table 1 below. Additional support for random message generation, noise generation, and gathering performance statistics was also included. The decoder uses LLRs quantized to eight bits.

TABLE 1

| Code Rates | Code Lengths | Modulations | Bit Mappings | Demodulator Types |
|---|---|---|---|---|
| 1/2 | 1024 | BPSK | Natural | LLR |
| 2/3 | 4096 | QPSK | Gray | Approximate LLR |
| 4/5 | 16384 | 8-PSK | Anti-Gray | Hard decision LLR |
|  |  | 16-APSK | DVB-S2 |  |
|  |  | 32-APSK |  |  |

The same encoder/decoder software was used for all nine codes. Prior to simulating the coded modulation, the software reads an initialization file that defines the protograph LDPC code's input and output length, circulant size, number of check and variable nodes in the protograph, number of edges in the protograph, a compact representation of the generator matrix, and an edgelist describing the parity check protograph and circulant offsets.

Table 2 shows the encoding and decoding speed of the C simulations, when compiled with a GNU C compiler on a typical desktop PC (a 3 GHz Intel Xeon processor running linux). The decoder is an 8-bit message passing decoder that stops iterating when a codeword is found. Because more iterations are needed at lower signal-to-noise ratios (SNRs), the speed of such a variable iterations decoder is sensitive to the SNR. The speeds reported in the table refer to a simulation with BPSK modulation, soft decisions, and operation at the $E_b/N_0$ shown, which in each case corresponds to operation at a codeword error rate of about $10^{-4}$ and represents a reasonable lower limit on the $E_b/N_0$ at which the decoder would be operated in practice. The software simulation was found to spend only a small fraction of its running time computing LLRs. Most of the time is spent performing decoder iterations. This is true even with the high order modulations such as 16-APSK and 32-APSK, where exact LLR computations amounted to only about 5 percent of the overall simulation time. As a result, the numerical results reported in this disclosure used the exact LLR expression of Eq. 14, and not the lower-complexity approximate LLR expressions described above.

Table 2 below shows the encoding speeds achieved using a software encoder in C on a standard desktop. Encoding speeds ranged from 1.5 to 50 Mbps.

TABLE 2

| Input Length | Code Rate | $E_b/N_b$ (dB) | Average Iterations | Enc. Speed (Mbps) | Dec. Speed (Mbps) |
|---|---|---|---|---|---|
| 1024 | 1/2 | 1.80 | 16.44 | 14.0 | 0.597 |
| 1024 | 2/3 | 2.60 | 12.86 | 25.9 | 0.928 |
| 1024 | 4/5 | 3.70 | 9.20 | 49.5 | 1.410 |
| 4096 | 1/2 | 1.25 | 27.75 | 8.23 | 0.357 |
| 4096 | 2/3 | 2.00 | 22.94 | 14.4 | 0.537 |
| 4096 | 4/5 | 3.00 | 16.74 | 33.8 | 0.789 |
| 16384 | 1/2 | 0.95 | 46.03 | 1.57 | 0.219 |
| 16384 | 2/3 | 1.75 | 35.11 | 3.53 | 0.347 |
| 16384 | 4/5 | 2.75 | 23.97 | 6.45 | 0.541 |

A separate MATLAB implementation of equivalent functionality was also developed. The MATLAB implementation was found to run about 50 times slower. Simulation results reported in this disclosure were collected with the C software.

The numerical results obtained from the simulations are presented below. This results include: the performance of AR4JA codes when used with a variety of modulations, an optimized bit-mapping, an optimum demodulator (LLR computation), and the optimized decoder algorithms described above.

Figure 14:
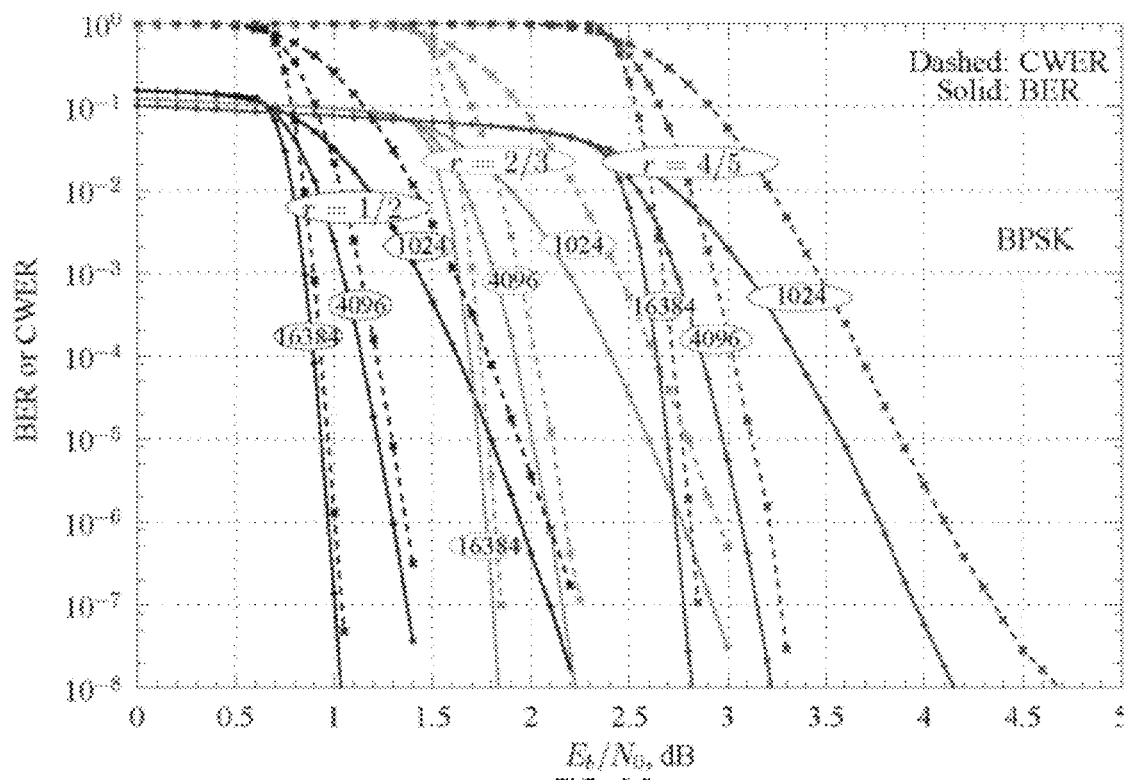
FIG. 14 is a graph of performance of AR4JA LDPC coded BPSK/QPSK.

FIG. 14 shows the performance of AR4JA coded BPSK or QPSK on an AWGN channel, demodulated with an exact LLR computation and quantized to 8 bits, and decoded using up to a maximum of 200 iterations. BERs and CWERs are shown for codes of input codeword lengths k=1024, k=4096, and k=16384 and rates ½, ⅔, and ⅘. These simulation results are in agreement with those reported elsewhere (see, for example, K. S. Andrews, D. Divsalar, S. Dolinar, J. Hamkins, C. R. Jones, and F. Pollara, "The development of turbo and LDPC codes for deep-space applications," *Proceedings of the IEEE*, 95(11):2142-2156, November 2007), except that the error floors have been eliminated.

Figure 15:
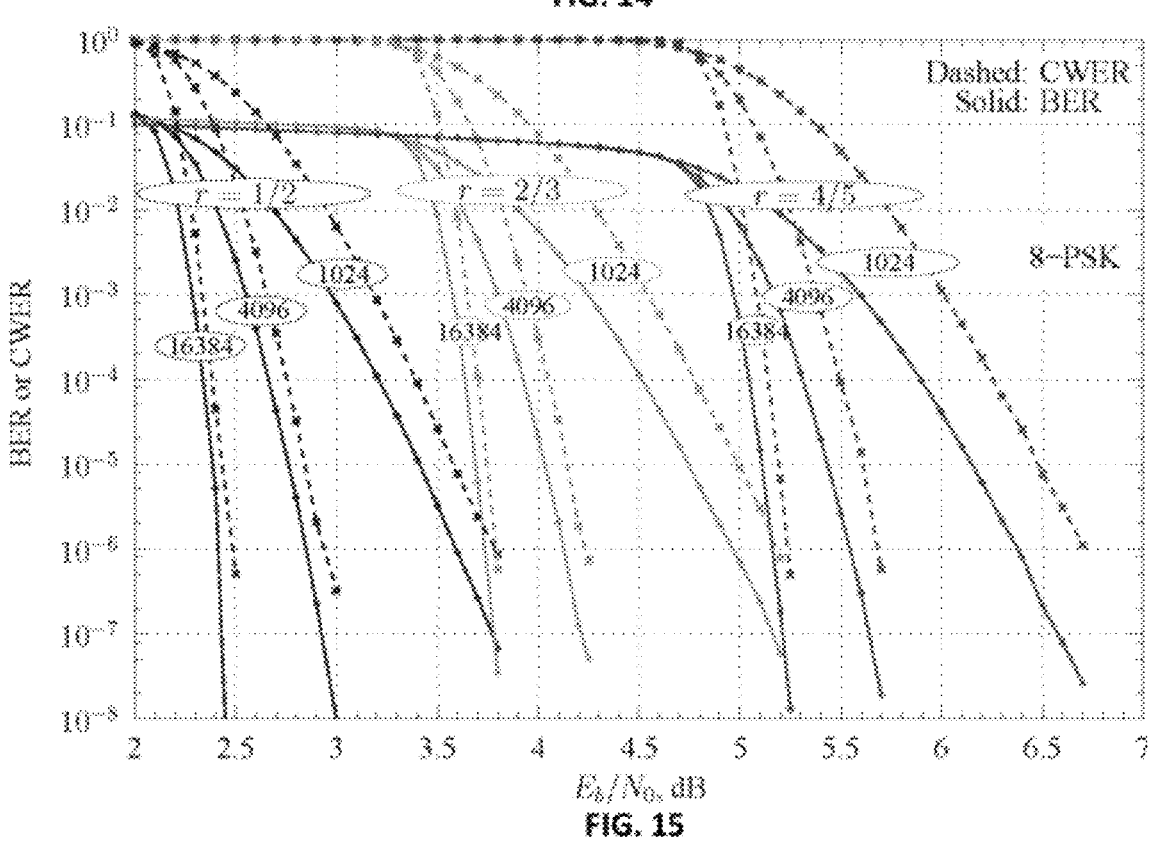
FIG. 15 is a graph of performance of AR4JA LDPC coded 8-PSK.

FIG. 15 shows the performance of AR4JA LDPC codes as before except that 8-PSK with a Gray mapping is used. BERs and CWERs are shown for codes of input codeword lengths k=1024, k=4096, and k=16384 and rates ½, ⅔, and ⅘.

Figure 16:
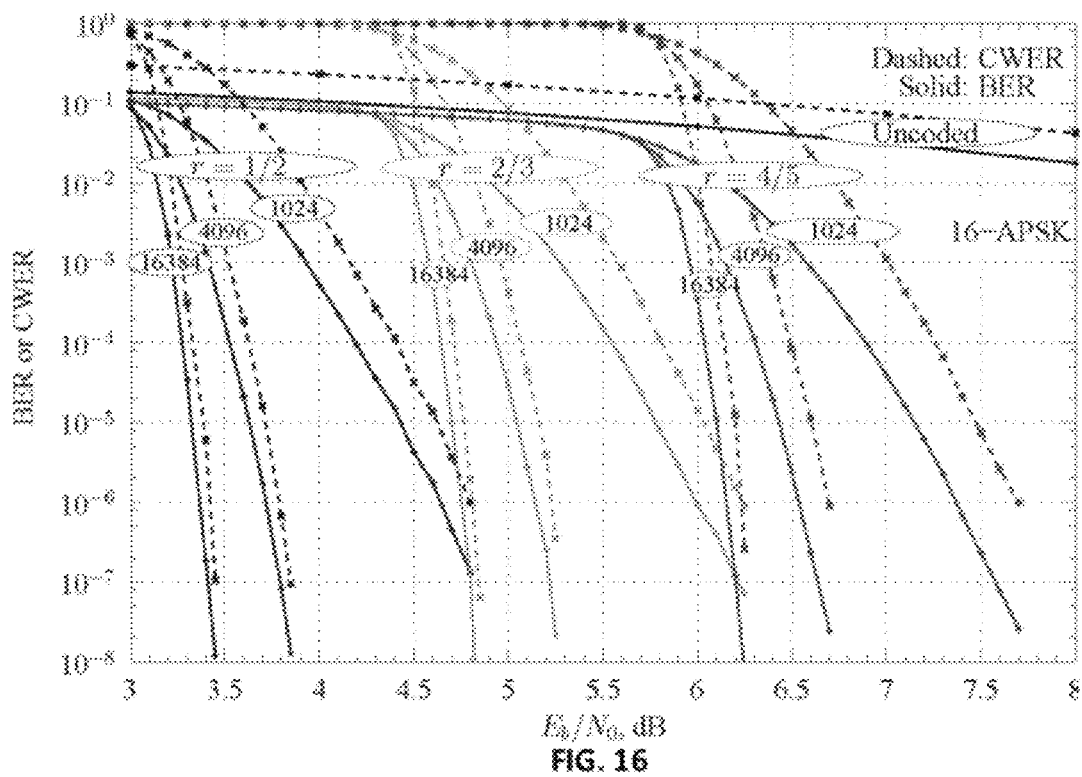
FIG. 16 is a graph of performance of AR4JA LDPC coded 16-APSK.
Figure 17:
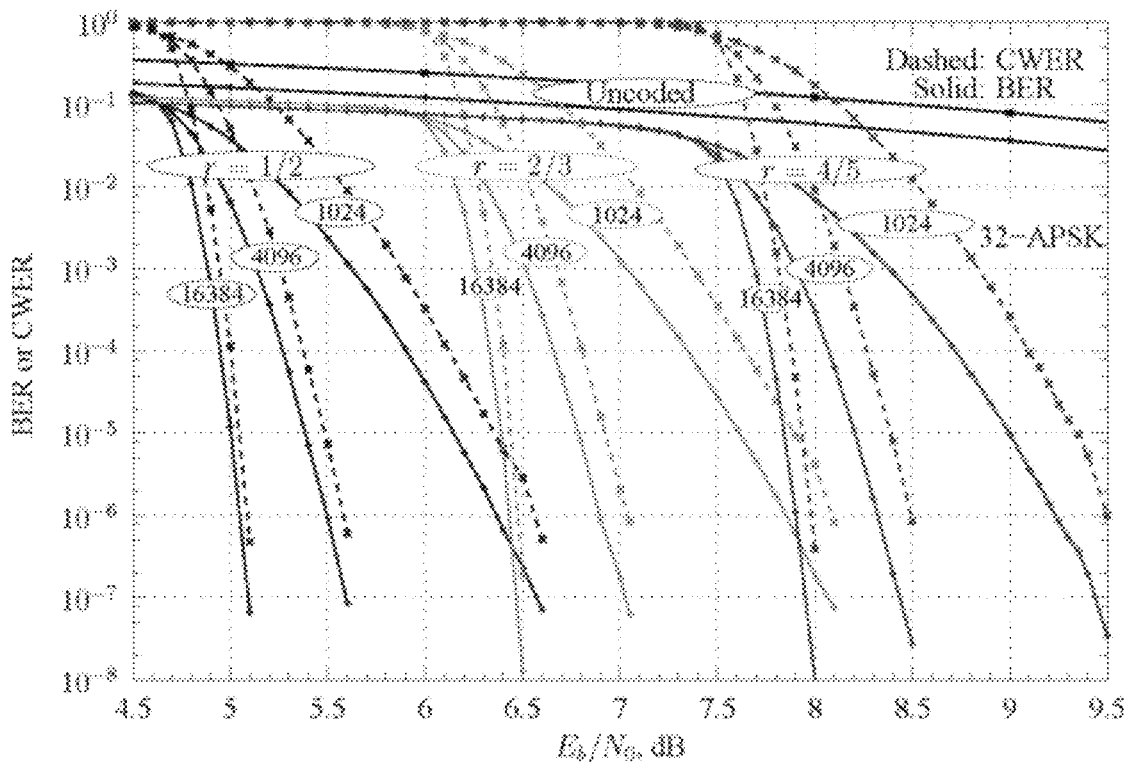
FIG. 17 is a graph of performance of AR4JA LDPC coded 32-APSK.

FIGS. 16 and 17 show the performance of AR4JA as before, except that 16-APSK and 32-APSK, respectively, with the DVB-S2 mapping is used. BERs and CWERs are shown for codes of input codeword lengths k=1024, k=4096, and k=16384 and rates ½, ⅔, and ⅘.

Figure 18:
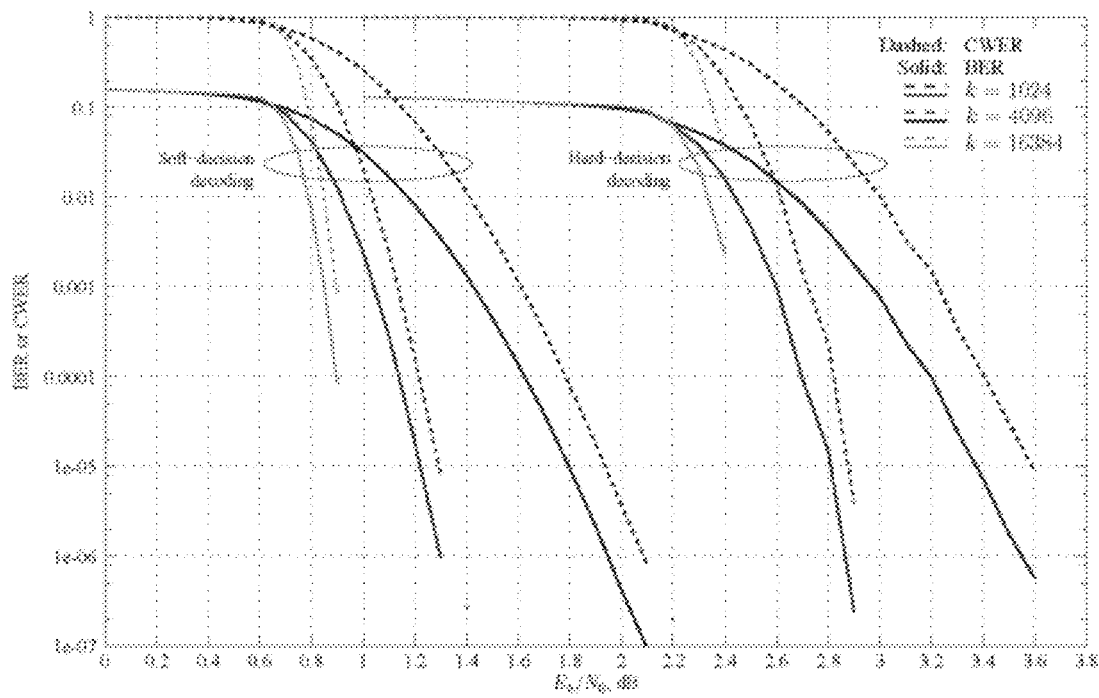
FIG. 18 is a graph of rate ½ AR4JA LDPC coded BPSK/QPSK using a hard decision demodulator.
Figure 19:
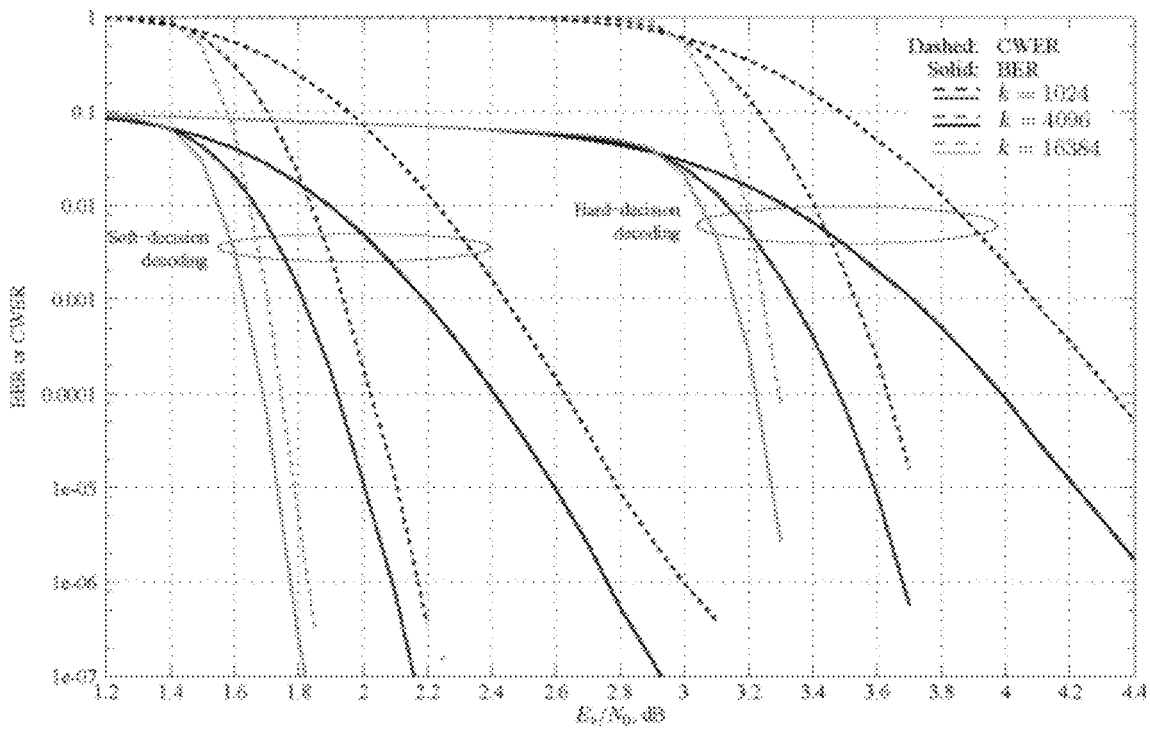
FIG. 19 is a graph of rate ⅔ AR4JA LDPC coded BPSK/QPSK using a hard decision demodulator.
Figure 20:
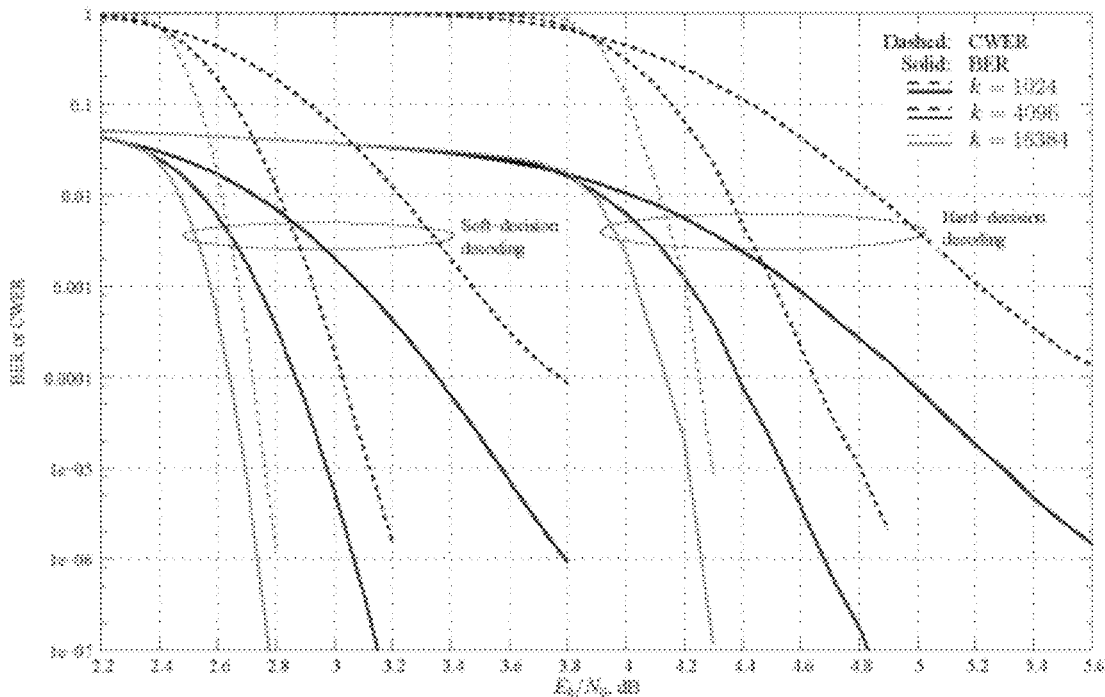
FIG. 20 is a graph of rate ⅘ AR4JA LDPC coded BPSK/QPSK using a hard decision demodulator.

FIGS. 18, 19, and 20 show the loss when the demodulator uses hard decision decoding. When taking a hard-decision input, the decoder uses Eq. 21 as its LLR. The results shown are for the nine AR4JA codes used with BPSK on an AWGN channel. For all nine codes, the loss due to hard decision decoding is seen to be about 1.6 dB at CWER=$10^{-4}$.

This disclosure presents a set of simulation results for LDPC codes in combination with several modulations. The numerical results are consistent with previous results, except that a new partial hard-limiter for check node messages has been introduced to eliminate error floors. The simulation results provide a foundation for the design of variable coded modulation (VCM) or adaptive coded modulation (ACM) schemes.

Performance depends on optimization of bit-to-symbol mapping in the modulator, LLR computation by the demodulator, and on the decoder's quantization dynamic range and step size, variable node clipping strategy, check node partial hard-limiting, and number of iterations. With careful optimizations, error floors can be avoided down to below CWER=$10^{-6}$. Error floors may be lower, as they were not reached with the simulations conducted here. Performance is not sensitive to ring ratios used in 16-APSK and 32-APSK, nearest neighbor approximations to the LLR, and maximum iterations beyond about 200. Use of an interleaver may be avoided without performance degradation. Those skilled in the art will understand that iterative demodulating and decoding, while not specifically discussed herein, may provide for additional performance improvements.

Figure 21A:
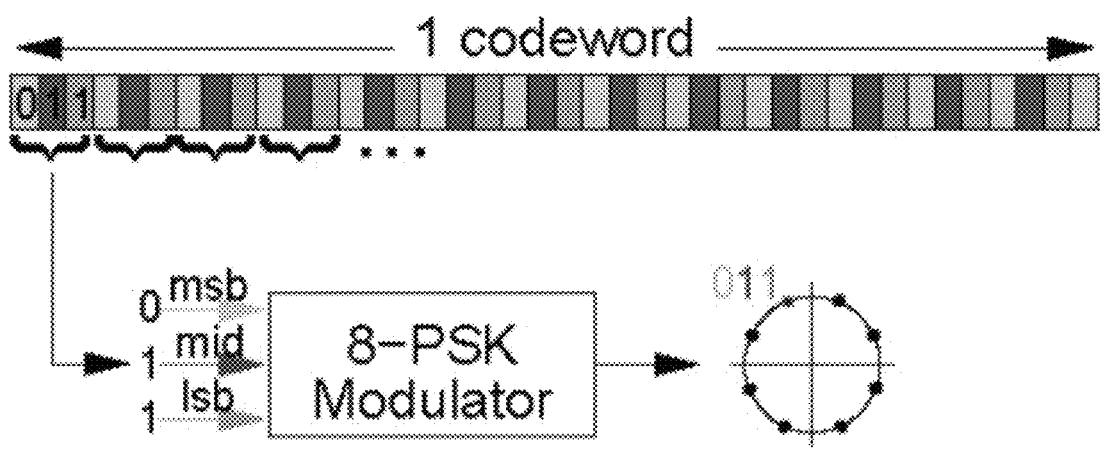
FIG. 21A depicts non-interleaved coded modulation.

As noted above, the methods and systems described herein did not make use of an interleaver—each set of adjacent codebits was grouped and used as input to the modulator, as shown in FIG. 21A for 8-PSK. Different shadings in FIG. 21A in the bit positions in the codeword are used to correspond to the most significant bit, middle bit, and least significant bit shown in the 8-PSK signal constellation in FIG. 1C. When a codeword is not a multiple of the number of bits per modulation symbol, the modulator input can be padded with zeros to generate the final symbol, or combined with the first bits of the following codeword.

Figure 22:
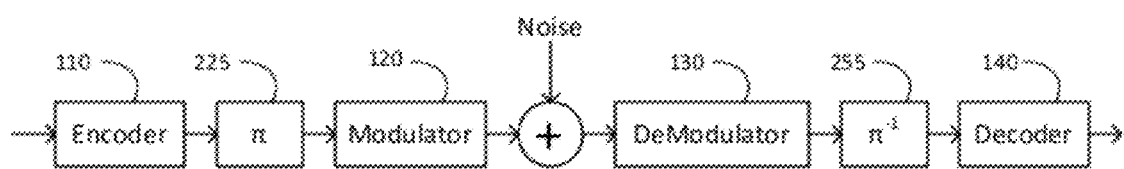
FIG. 22 shows a block diagram of a system in which LDPC encoding is used for the transmission of information in which interleaving and deinterleaving is used.

Not using an interleaver may make a code vulnerable to losses when used with higher order modulations, because a weakly received modulation symbol may give rise to multiple poor codebit LLRs. An interleaver helps distribute these bursts of poor LLRs across multiple codewords, instead of bunching them in a single codeword. Codebits are passed through an interleaver, $\pi$, prior to modulation, and a de-interleaver, $\pi^{-1}$, after demodulation, as shown in FIG. 22. FIG. 22 shows a block diagram of a system in which LDPC encoding is used for the transmission of information similar to that shown in FIG. 24, except that an interleaving and deinterleaving elements are added. As shown in FIG. 22, an interleaver 225 is disposed between the encoder 110 and the modulator 120. A de-interleaver 255 is disposed between the demodulator 130 and the decoder 140.

Figure 21B:
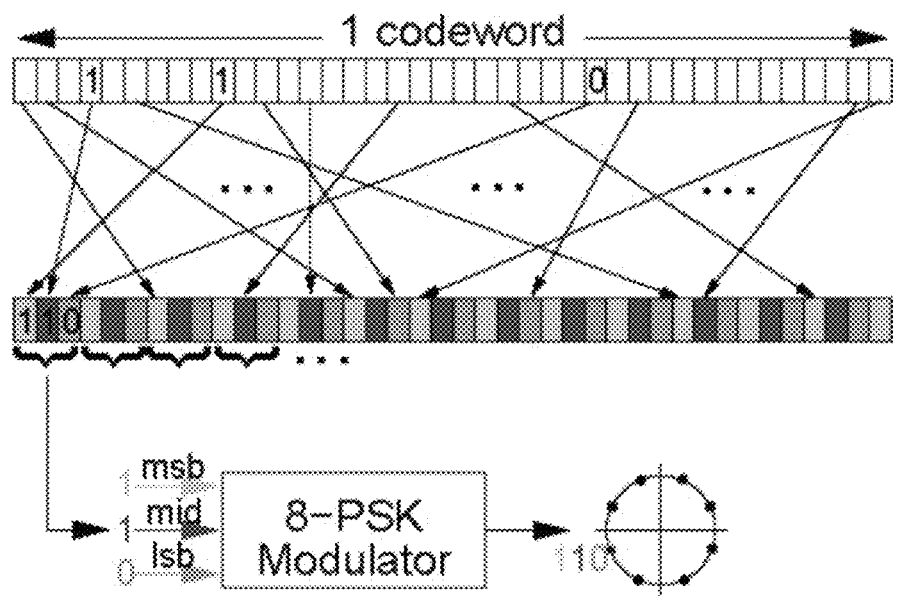
FIG. 21B depicts a single codeword interleaver.

In the single codeword interleaver, the bits within a codeword are re-ordered arbitrarily, as shown in FIG. 21B, prior to being mapped to modulation symbols. In principle, any interleaver of this type may simply be incorporated into the definition of the LDPC code, with no need to refer to an additional interleaver. However, it was convenient to define the AR4JA codes in the way they were because they have the quasi-cyclic property, which simplifies the encoding process. Changing the definition of the code to reorder the bits would destroy this property.

Figure 21C:
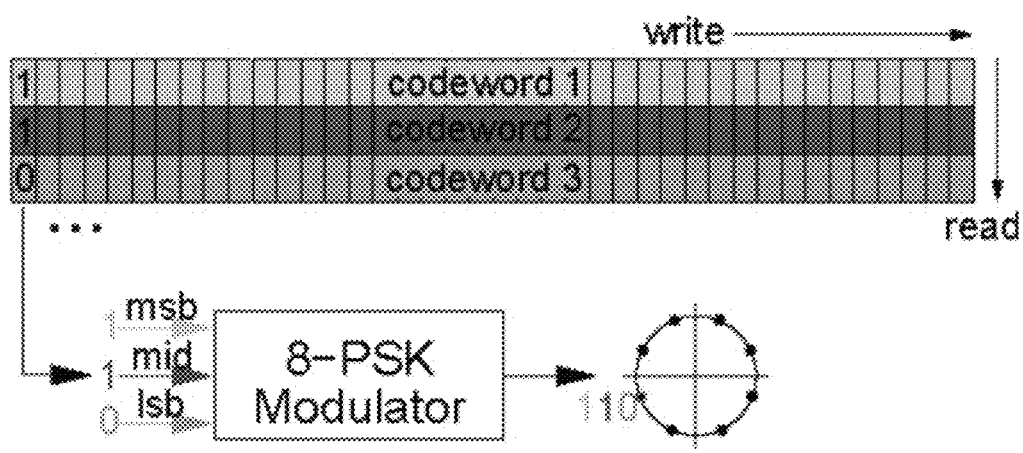
FIG. 21C depicts a block interleaver.
Figure 23:
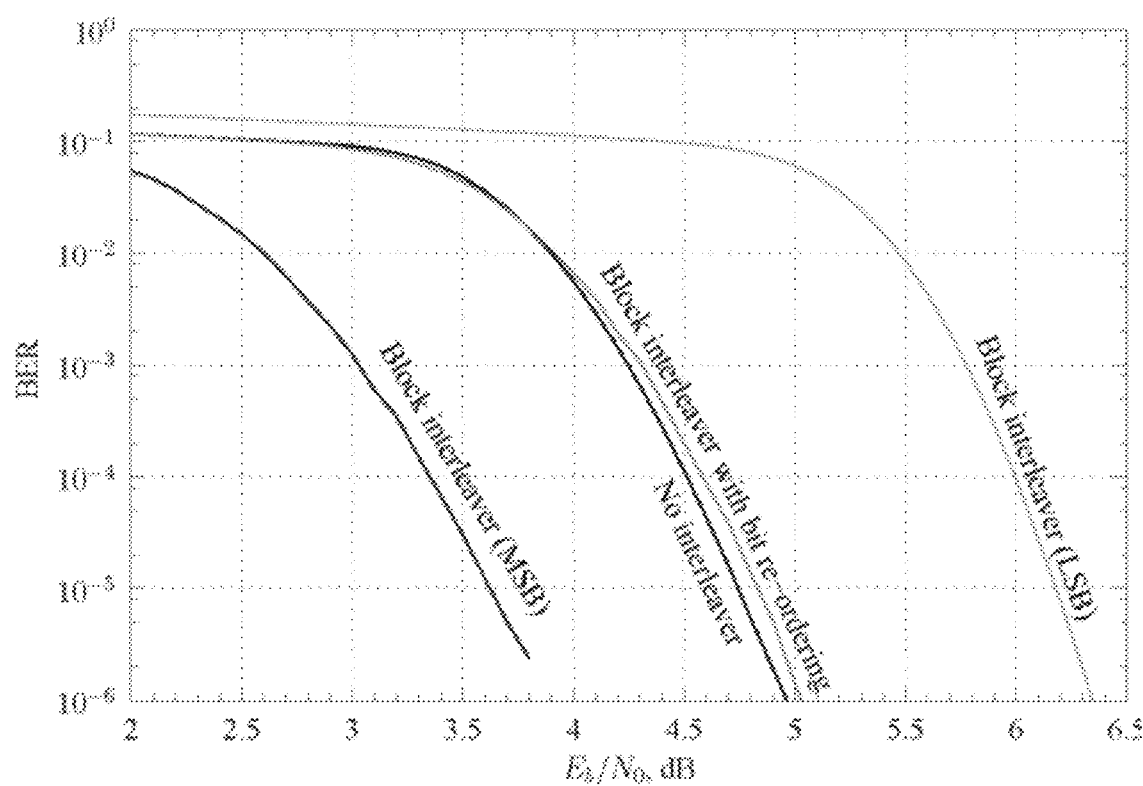
FIG. 23 is a graph of performance of coded modulation when not interleaved, block interleaved, and block interleaved with bit-reordering.

In a block interleaver, codewords are written in rows and read out in columns, as shown in FIG. 21C, again for 8-PSK. In the usual type of block interleaver, the first codeword would always correspond to the msb, the second codeword to the middle bit, and the third codeword to the lsb. As noted in FIGS. 6 and 7, the lsb of Gray-coded 8-PSK has worse distance properties, which means that the error rate for the codeword 3 using the lsbs will be much worse. This is shown in FIG. 23. The performance of codewords mapped to the MSB is very good, while those mapped to the LSB are quite poor, and the average performance would be dominated by the poor LSB performance. As a result, a block interleaver of this type should not be used with modulations whose bits have different distance properties.

Figure 21D:
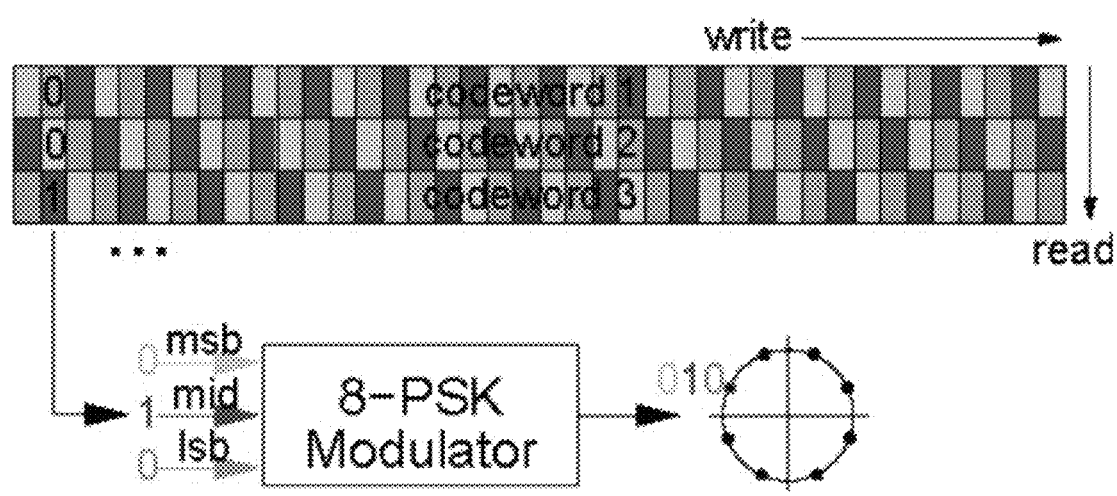
FIG. 21D depicts a block interleaver with bit-reordering.

In a block interleaver with bit-reordering, codewords are written in rows and read out in columns, but the bits are reordered within each codeword, as shown in FIG. 21D, again for 8-PSK. In this type of block interleaver, different bits within each codeword will correspond to the msb, middle bit, and the lsb. This type of block interleaver should show better performance than seen with the block interleaver described above.

Additionally, FIG. 23 indicates that a block interleaver with bit re-ordering does not offer an advantage over the non-interleaved coded modulation. This implies that the AR4JA codes are inherently resilient to the bursts of poor LLRs that result from the use of a higher order modulation. This may be because the number of bits per modulation symbol, five or less, is small compared to the codeword length, which is 1280 or longer.

The present disclosure has described different decoder variations. Application of these different variations in a cumulative manner, as described above, had different impacts on improving the error floor. The results of these decoder variations are summarized below.

1. Exact min*.

The decoder was altered to use an exact min* computation that incorporates the min* term and both log correction terms prior to quantization. This made no discernible difference in the error floor.

2. Jones Clipping.

Introducing Jones clipping reduces the error floor by one decade, to about CWER=$10^{-5}$. This is seen in the curve labeled "with Jones clipping" in FIG. 13.

3. Clipping Degree-1 Variable Nodes.

The description above describes a floor that occurs when channel symbol LLRs going into degree-1 variable nodes are not clipped to levels below the maximum magnitude of check node messages. The reason for the floor is that a strong but wrong channel symbol LLR is not able to be overcome by the single message from the check node. For the (1024,⅘) code with 128 degree-1 variable nodes, channel symbol LLRs clipped to 15.875, and a decoder with maximum check node message 15.125, the theoretical floor, $128Q((4E_s/N_0+15.125)/\sqrt{8E_s/N_0})$, is shown in FIG. 13. The theoretical floor reaches a maximum of approximately $2.4\times10^{-6}$ at $E_b/N_0\approx6.7$ dB, and then trends lower at higher SNR.

Figure 2:
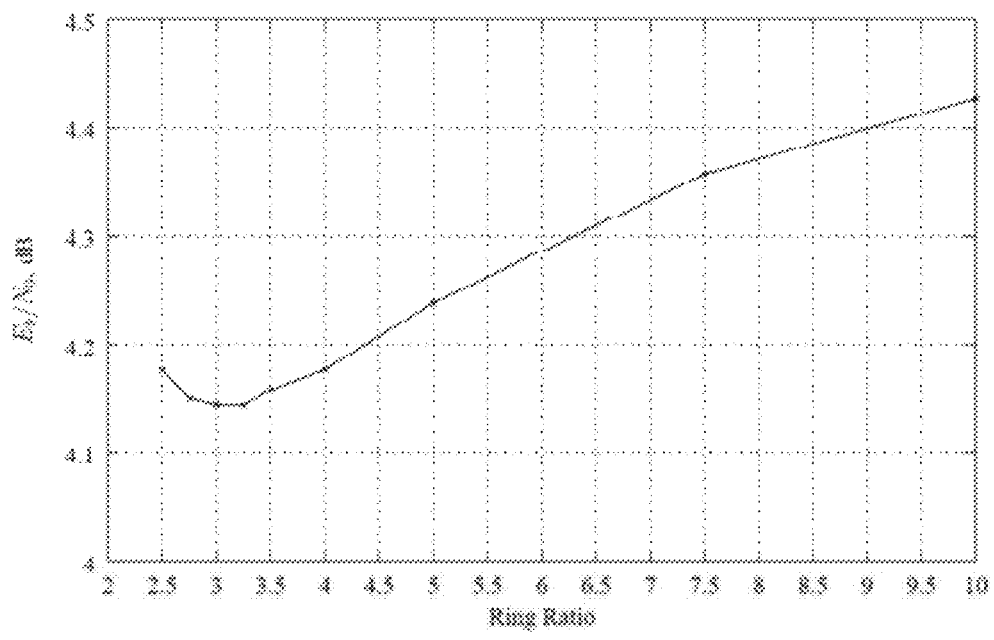
FIG. 2 is a graph of the required energy to noise ratio to achieve a desired codeword error rate for AR4JA coded 16-APSK as a function of the outer-to-inner ring ratio.

Altering the decoder to clip degree-1 variable nodes to 116/8=14.5 made little difference in the error floor, as seen in the red curve labeled "degree-1 clipping" in FIG. 2, because the degree-1 problem was not the dominant flooring effect in this decoder in the region simulated.

4. Dynamic Range Adjustment.

The JH2009 decoder used integers −127 to 127 to represent LLRs ranging from −15.875 to +15.875, in uniform steps of ⅛. Using a different step size (and thus different total dynamic range) affects decoder performance, but the range (15.875,+15.875) was found to be near-optimal, at least in the waterfall region.

5. Additive Unreliability at Check Node.

The rate ⅘ AR4JA codes have degree-18 check nodes. To compute a min* function of 17 variables, multiple 2-input min* functions are repeatedly computed, using a tree-structure. Since each min* involves quantization noise, the total quantization noise for the min* with 17 variables could be large. As an alternative, each reliability message from a variable node can be transformed to an unreliability, and these may be added at the check node. This addition can be performed exactly, and the result can be transformed back to a reliability and re-quantized only at the end of this computation. However, this alteration had no discernible effect on error-floor performance, as seen in FIG. 13.

6. Hard-Limit Check Node Messages.

The hard-limit check node decoder variation made a big difference in the error floor performance. The decoder was altered to partially hard-limit messages from the check nodes, so that every message from a check node which would otherwise have a magnitude at least 100 was re-assigned to have magnitude 127. This resulted in the performance in FIG. 10. As can be seen, the floor was reduced to about CWER=3×$10^{-8}$ and BER=3×$10^{-10}$, with no loss in the waterfall region. The average number of iterations in the waterfall region is the same as for the JH2009 decoder, so this decoder provides for low-complexity error-floor mitigation.

Embodiments of the present invention may utilize the decoder improvements discussed above. Systems using decoders with such improvements may also utilize interleavers as discussed above. Such embodiments may provide for improved performance in the presence of higher noise levels and/or allow for higher transmission rates and/or allow for faster decoder performance.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A method for decoding a low-density parity-check (LDPC) coded signal transmitted in a channel, the method comprising:
   receiving input messages comprising the LDPC coded signal for subsequent processing on a bipartite graph, wherein the bipartite graph comprises variable nodes and check nodes representing an LDPC code;
   passing messages along edges of the bipartite graph, wherein passing messages comprises iteratively passing messages from the variable nodes to the check nodes and from the check nodes to the variable nodes;
   assigning a maximum positive value to every message from each check node greater than or equal to a selected positive limit value;
   assigning a minimum negative value to every message from each check node less than or equal to a selected negative limit value; and
   outputting a decoded message when convergence is reached or a selected number of iterations is reached.

2. The method according to claim 1, wherein absolute values of the maximum positive value and the minimum negative value are equal to a maximum magnitude.

3. The method according to claim 2, further comprising:
   quantizing each input message to a fixed quantization level between a maximum quantization value and a minimum quantization value, wherein absolute values of the maximum quantization value and the minimum quantization value are equal to an absolute maximum quantization value and the maximum magnitude is equal to the absolute maximum quantization value.

4. The method according to claim 3, wherein quantizing each input message comprises setting each input message to an integer value equal to or between −127 and +127, and wherein the maximum magnitude is equal to 127.

5. The method according to claim 4, wherein the selected positive limit value is +100 and the selected negative limit value is −100.

6. The method according to claim 1, further comprising
summing all messages into at least one variable node to provide a variable node sum comprising a variable node sign and a variable node sum magnitude;
setting the variable node sum magnitude to a selected maximum variable node magnitude if the variable node sum magnitude exceeds the selected maximum variable node magnitude;
forming an intermediate message by subtracting one of the messages into the at least one variable node from the variable node sum to provide the intermediate message, wherein the intermediate message comprises an intermediate message magnitude and an intermediate message sign; and
forming an outgoing message by setting the intermediate message magnitude to a selected maximum intermediate magnitude if the intermediate message magnitude exceeds a selected intermediate magnitude, wherein the outgoing message comprises the intermediate message magnitude and the intermediate message sign.

7. The method according to claim 2, wherein the variable nodes comprise one or more degree-1 variable nodes and the method further comprising clipping messages received from the channel and input into the degree-1 variable nodes to a level below the maximum magnitude.

8. A digital communication receiving system, wherein the digital communication receiving system is configured to receive transmissions encoded with a low-density parity-check code, the system comprising:
a demodulator, wherein the demodulator receives modulated data and outputs demodulated data; and
a decoder, wherein the decoder decodes demodulated data from the demodulator to output decoded data by performing several processing steps, wherein the several processing steps comprise:
receiving the demodulated data as inputs to variable nodes of a bipartite graph, wherein the bipartite graph comprises variable nodes and check nodes representing the low-density parity-check code;
passing messages along edges of the bipartite graph, wherein passing messages comprises iteratively passing messages from the variable nodes to the check nodes and from the check nodes to the variable nodes;
assigning a maximum positive value to every message from each check node greater than or equal to a selected positive limit value;
assigning a minimum negative value to every message from each check node less than or equal to a selected negative limit value; and
outputting the decoded data when convergence is reached or a selected number of iterations is reached.

9. The digital communication receiving system according to claim 8, wherein absolute values of the maximum positive value and the minimum negative value are equal to a maximum magnitude.

10. The digital communication receiving system according to claim 9, wherein the demodulated data comprises a plurality of input messages and wherein the several processing steps additionally comprise:
quantizing each input message to a fixed quantization level between a maximum quantization value and a minimum quantization value, wherein absolute values of the maximum quantization value and the minimum quantization value are equal to an absolute maximum quantization value and the maximum magnitude is equal to the absolute maximum quantization value.

11. The digital communication receiving system according to claim 10, wherein quantizing each input message comprises setting each input message to an integer value equal to or between −127 and +127, and wherein the maximum magnitude is equal to 127.

12. The digital communication receiving system according to claim 11, wherein the selected positive limit value is +100 and the selected negative limit value is −100.

13. The digital communication receiving system according to claim 9, wherein the several processing steps additionally comprise:
summing all messages into at least one variable node to provide a variable node sum comprising a variable node sign and a variable node sum magnitude;
setting the variable node sum magnitude to a selected maximum variable node magnitude if the variable node sum magnitude exceeds the selected maximum variable node magnitude; and
forming an intermediate message by subtracting one of the messages into the at least one variable node from the variable node sum to provide the intermediate message, wherein the intermediate message comprises an intermediate message magnitude and an intermediate message sign; and,
forming an outgoing message by setting the intermediate message magnitude to a selected maximum intermediate magnitude if the intermediate message magnitude exceeds a selected intermediate magnitude, wherein the outgoing message comprises the intermediate message magnitude and the intermediate message sign.

14. The digital communication receiving system according to claim 9, wherein the variable nodes comprise one or more degree-1 variable nodes and wherein the several processing steps additionally comprise:
clipping messages received from the demodulator and input into the degree-1 variable nodes to a level below the absolute maximum magnitude.

15. The digital communication receiving system according to claim 8, wherein the demodulator forms a log likelihood ratio and the decoder receives the log likelihood ratio as an input.

16. The digital communication receiving system according to claim 8 further comprising a de-interleaver, wherein the de-interleaver receives demodulated data from the demodulator and outputs de-interleaved data to the decoder.

17. The digital communication receiving system according to claim 16, wherein the de-interleaver comprises a single codeword de-interleaver; a block de-interleaver, or a block de-interleaver with bit reordering.

18. The digital communication receiving system according to claim 8, wherein the decoder is implemented with one or more programmable gate arrays.

19. A method for decoding a low-density parity-check (LDPC) coded signal transmitted in a channel, the method comprising:

receiving input messages comprising the LDPC coded signal for subsequent processing on a bipartite graph, wherein the bipartite graph comprises variable nodes and check nodes representing an LDPC code;

passing messages along edges of the bipartite graph, wherein passing messages comprises iteratively passing messages from the variable nodes to the check nodes and from the check nodes to the variable nodes;

assigning a maximum positive value to at least one message from at least one check node greater than or equal to a selected positive limit value;

assigning a minimum negative value to at least one message from at least one check node less than or equal to a selected negative limit value; and outputting a decoded message when convergence is reached or a selected number of iterations is reached.

20. The method according to claim 19, wherein absolute values of the maximum positive value and the minimum negative value are equal to an absolute maximum magnitude.

* * * * *